(12) United States Patent
Shealy et al.

(10) Patent No.: US 7,772,927 B1
(45) Date of Patent: Aug. 10, 2010

(54) ACTIVE BIAS DARLINGTON AMPLIFIER

(75) Inventors: Jeffrey B. Shealy, Huntersville, NC (US); Philip M. Garber, Huntersville, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 51 days.

(21) Appl. No.: 12/245,949

(22) Filed: Oct. 6, 2008

Related U.S. Application Data

(60) Provisional application No. 60/977,504, filed on Oct. 4, 2007.

(51) Int. Cl.
*H03F 1/30* (2006.01)

(52) U.S. Cl. ........................ 330/290; 330/310

(58) Field of Classification Search .......... 330/290, 330/150, 98, 310
See application file for complete search history.

(56) References Cited

U.S. PATENT DOCUMENTS

| | | | | |
|---|---|---|---|---|
| 3,898,577 | A * | 8/1975 | Halsey | 330/293 |
| 5,047,731 | A * | 9/1991 | Lee | 330/282 |
| 5,859,568 | A * | 1/1999 | Le et al. | 330/289 |
| 6,727,762 | B1 * | 4/2004 | Kobayashi | 330/295 |
| 6,933,787 | B1 * | 8/2005 | Kobayashi | 330/311 |
| 6,972,630 | B2 | 12/2005 | Kobayashi | |
| 7,253,689 | B2 * | 8/2007 | Devendorf et al. | 330/311 |
| 7,439,805 | B1 * | 10/2008 | Kobayashi | 330/277 |
| 7,619,482 | B1 * | 11/2009 | Kobayashi | 330/311 |

OTHER PUBLICATIONS

SBB5089Z Product Data Sheet, 2005, Sirenza Microdevices.
WJA1001, WJA1010, WJA1015, WJA1020, and WJA1500 Product Data Sheets, all from Jul. 2008, WJ Communications, Inc. via TriQuint Semiconductor.
WJA1515, WJA1005, WJA1025, and WJA1035 Product Data Sheets, all from Aug. 2008, WJ Communications, Inc. via TriQuint Semiconductor.
WJA1510 Product Data Sheet, Oct. 2008, WJ Communications, Inc. via TriQuint Semiconductor.

* cited by examiner

*Primary Examiner*—Henry K Choe
(74) *Attorney, Agent, or Firm*—Withrow & Terranova, P.L.L.C.

(57) ABSTRACT

The present invention relates to an active bias Darlington pair amplifier that may operate without a traditional bias resistor. The active bias Darlington pair amplifier includes an output transistor element that is cascaded with and driven from a driver transistor element. Active bias circuitry provides bias to the driver transistor element to regulate bias current in the output transistor element. The bias current in the output transistor element is sensed by the active bias circuitry. The active bias circuitry may include alternating current (AC) circuitry, which may adjust bias under certain radio frequency (RF) drive conditions. The active bias Darlington pair amplifier may include feedback circuitry, which provides feedback from the output transistor element to the driver transistor element. The feedback circuitry may include AC circuitry, which may provide frequency dependent feedback.

25 Claims, 22 Drawing Sheets

ACTIVE BIAS DARLINGTON AMPLIFIER

This application claims the benefit of provisional patent application Ser. No. 60/977,504, filed Oct. 4, 2007, the disclosure of which is hereby incorporated herein by reference in its entirety.

FIELD OF THE INVENTION

Embodiments of the present invention relate to Darlington pair transistor amplifiers, which may be used in radio frequency (RF) communications circuits.

BACKGROUND OF THE INVENTION

Darlington pair transistor amplifiers are often used in applications needing large gains. A pair of transistor elements are cascaded to create an amplifier with a gain factor that is about equal to the product of the gain factors of each of the transistor elements. FIG. 1 shows a traditional Darlington pair amplifier 10, according to the prior art. A first NPN bipolar transistor element Q1 and a second NPN bipolar transistor element Q2 are cascaded to create a Darlington pair. The first NPN bipolar transistor element Q1 is an output transistor element and the second NPN bipolar transistor element Q2 is a driver transistor element that feeds the output transistor element. The collector of the first NPN bipolar transistor element Q1 provides an RF output signal $RF_{OUT}$. A first resistive element R1 is coupled between the emitter of the first NPN bipolar transistor element Q1 and ground. The base of the first NPN bipolar transistor element Q1 is coupled to the emitter of the second NPN bipolar transistor element Q2. A second resistive element R2 is coupled between the emitter of the second NPN bipolar transistor element Q2 and ground. The collector of the second NPN bipolar transistor element Q2 is coupled to the collector of the first NPN bipolar transistor element Q1. An RF input signal $RF_{IN}$ feeds the base of the second NPN bipolar transistor element Q2. A third resistive element R3 is coupled between the base of the second NPN bipolar transistor element Q2 and ground. A fourth resistive element R4 is coupled between the base of the second NPN bipolar transistor element Q2 and the collector of the second NPN bipolar transistor element Q2.

The third and fourth resistive elements R3, R4 may provide feedback, biasing, or both, for the traditional Darlington pair amplifier 10. Power for the traditional Darlington pair amplifier 10 is provided by external components, which are coupled to the collectors of the first and second NPN bipolar transistor elements Q1, Q2. A traditional bias resistor R5 and a first inductive element L1 are coupled in series between a direct current (DC) supply $V_{DCSUPPLY}$ and the collectors of the first and second NPN bipolar transistor elements Q1, Q2. The traditional bias resistor R5 is used to regulate bias current in the traditional Darlington pair amplifier 10. Without the traditional bias resistor R5, the bias current may vary greatly over temperature, with manufacturing process variations, or both. However, bias current through the traditional bias resistor R5 wastes power and lowers the operating voltage available to the traditional Darlington pair amplifier 10. The lowered operating voltage may reduce efficiency, may lower a 1 decibel (dB) compression point (P1dB), may lower an output third-order intercept point (OIP3), or any combination thereof, which may reduce the effectiveness of the traditional Darlington pair amplifier 10. Reducing the value of the traditional bias resistor R5 may restore some of the operating voltage; however, the bias current variations may be unacceptable.

Some applications require a Darlington pair amplifier that can be powered from a five volt or a three volt DC supply $V_{DCSUPPLY}$. Thus, there is a need for a Darlington pair amplifier that can operate without a traditional bias resistor R5 or operate with a reduced value traditional bias resistor R5, can operate properly with a five volt DC supply $V_{DCSUPPLY}$, a three volt DC supply $V_{DCSUPPLY}$, or both.

SUMMARY OF THE EMBODIMENTS

The present invention relates to an active bias Darlington pair amplifier that may operate without a traditional bias resistor. The active bias Darlington pair amplifier includes an output transistor element that is cascaded with and driven from a driver transistor element. Active bias circuitry provides bias to the driver transistor element to regulate bias current in the output transistor element. The bias current in the output transistor element is sensed by the active bias circuitry. The active bias circuitry may include alternating current (AC) circuitry, which may adjust bias under certain RF drive conditions. The active bias Darlington pair amplifier may include feedback circuitry, which provides feedback from the output transistor element to the driver transistor element. The feedback circuitry may include AC circuitry, which may provide frequency dependent feedback.

Some embodiments of the active bias Darlington pair amplifier may operate properly with a five volt DC supply $V_{DCSUPPLY}$, a three volt DC supply $V_{DCSUPPLY}$, or both. In one embodiment of the present invention, the output and driver transistor elements are NPN bipolar transistor elements. In an alternate embodiment of the present invention, the output and driver transistor elements are PNP bipolar transistor elements. In an additional embodiment of the present invention, the output and driver transistor elements are N-type field effect transistor (FET) elements. In another embodiment of the present invention, the output and driver transistor elements are P-type FET elements.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to an active bias Darlington pair amplifier that may operate without a traditional bias resistor. The active bias Darlington pair amplifier includes an output transistor element that is cascaded with and driven from a driver transistor element. Active bias circuitry provides bias to the driver transistor element to regulate bias current in the output transistor element. The bias current in the output transistor element is sensed by the active bias circuitry. The active bias circuitry may include alternating current (AC) circuitry, which may adjust bias under certain RF drive conditions. The active bias Darlington pair amplifier may include feedback circuitry, which provides feedback from the output transistor element to the driver transistor element. The feedback circuitry may include AC circuitry, which may provide frequency dependent feedback.

Some embodiments of the active bias Darlington pair amplifier may operate properly with a five volt DC supply $V_{DCSUPPLY}$, a three volt DC supply $V_{DCSUPPLY}$, or both. In one embodiment of the present invention, the output and driver transistor elements are NPN bipolar transistor elements. In an alternate embodiment of the present invention, the output and driver transistor elements are PNP bipolar transistor elements. In an additional embodiment of the present invention, the output and driver transistor elements are N-type field effect transistor (FET) elements. In another embodiment of the present invention, the output and driver transistor elements are P-type FET elements.

Figure 1:
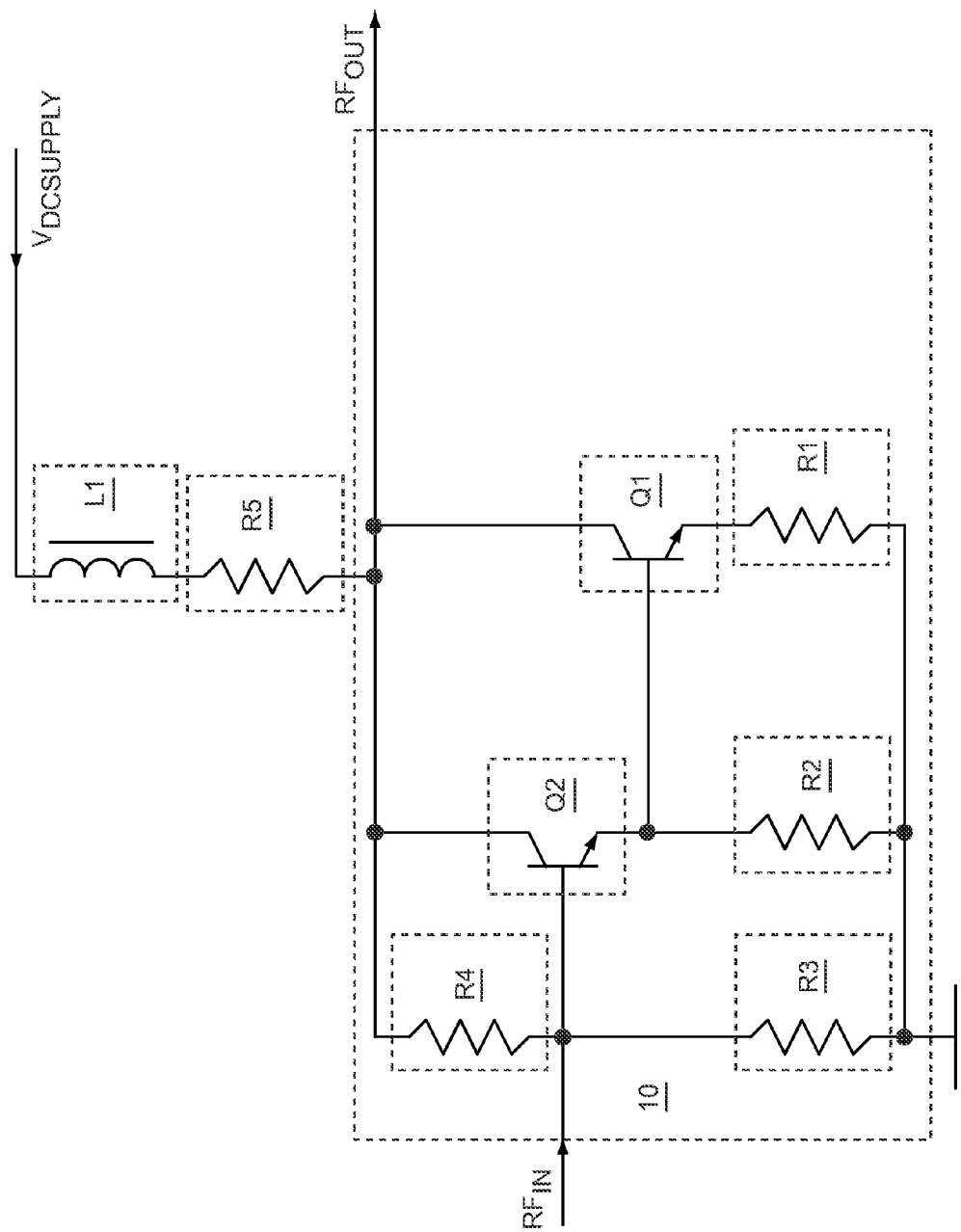
FIG. 1 shows a traditional Darlington pair amplifier, according to the prior art.
Figure 2:
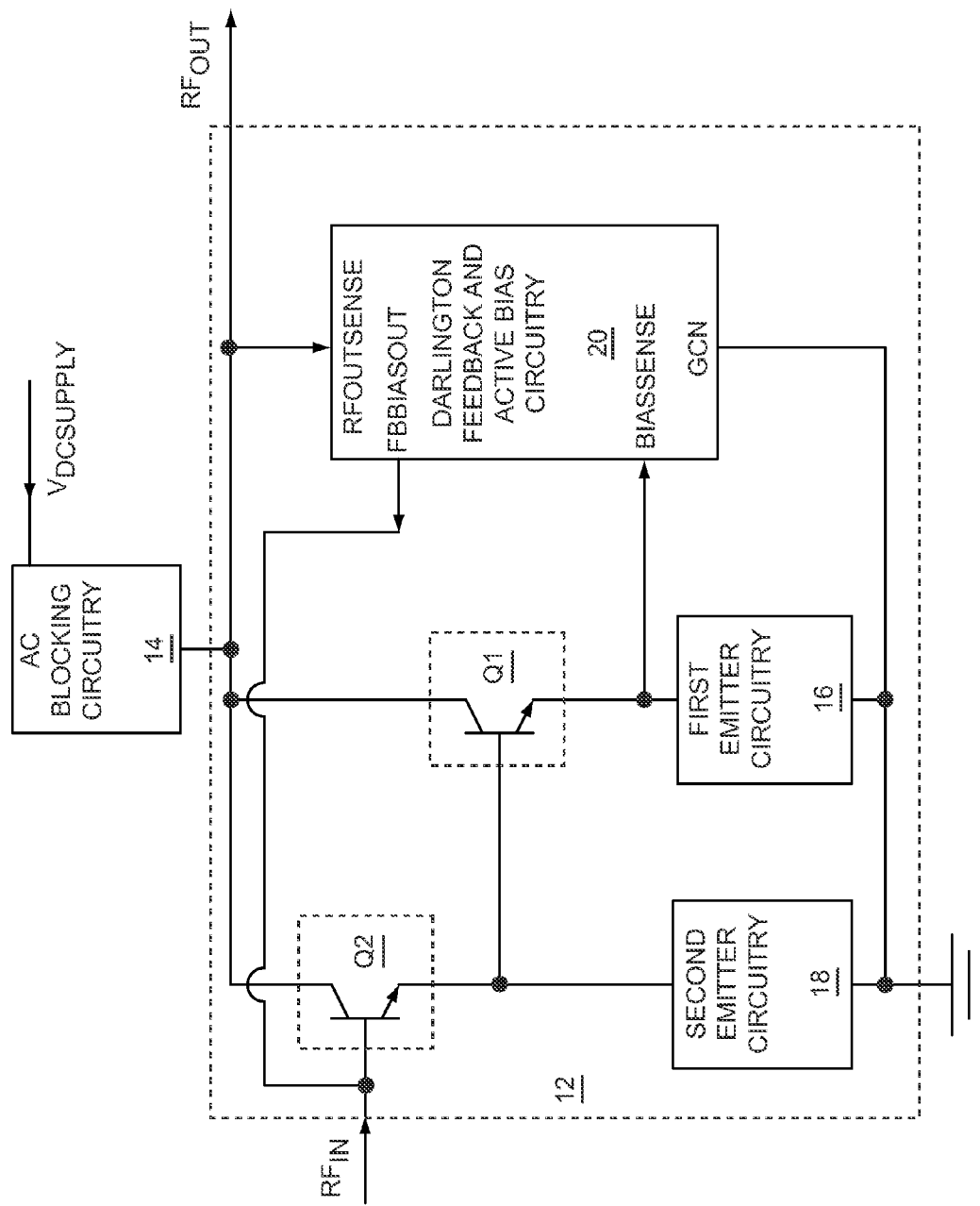
FIG. 2 shows an active bias Darlington pair amplifier based on NPN bipolar transistor elements, according to one embodiment of the present invention.

FIG. 2 shows an active bias Darlington pair amplifier 12 based on NPN bipolar transistor elements, according to one embodiment of the present invention. The first NPN bipolar transistor element Q1 and the second NPN bipolar transistor element Q2 are cascaded to create a Darlington pair. The first NPN bipolar transistor element Q1 is an output transistor element and the second NPN bipolar transistor element Q2 is a driver transistor element that feeds the output transistor element. The collector of the first NPN bipolar transistor element Q1 provides an RF output signal $RF_{OUT}$. Power for the active bias Darlington pair amplifier 12 may be provided using one or more external components, which are coupled to the collector of the first NPN bipolar transistor elements Q1. AC blocking circuitry 14 is an external component that is coupled between a DC supply $V_{DCSUPPLY}$ and the collector of the first NPN bipolar transistor elements Q1. The AC blocking circuitry 14 isolates the DC supply $V_{DCSUPPLY}$ from the RF output signal $RF_{OUT}$. In an alternate embodiment of the present invention, the active bias Darlington pair amplifier 12 may receive power using one or more internal components.

First emitter circuitry 16 is coupled between the emitter of the first NPN bipolar transistor element Q1 and ground. The base of the first NPN bipolar transistor element Q1 is coupled to the emitter of the second NPN bipolar transistor element Q2. Second emitter circuitry 18 is coupled between the emitter of the second NPN bipolar transistor element Q2 and ground. The collector of the second NPN bipolar transistor element Q2 is coupled to the collector of the first NPN bipolar transistor element Q1. An RF input signal $RF_{IN}$ feeds the base of the second NPN bipolar transistor element Q2. Darlington feedback and active bias circuitry 20 is used to provide feedback and active bias to the active bias Darlington pair amplifier 12.

The Darlington feedback and active bias circuitry 20 includes a bias sense input BIASSENSE, an RF output sense input RFOUTSENSE, a feedback and bias output FBBIASOUT, and a ground connection node GCN. The bias sense input BIASSENSE is coupled to and senses bias conditions at the emitter of the first NPN bipolar transistor element Q1. The bias conditions may include the voltage across the first emitter circuitry 16. The RF output sense input RFOUTSENSE is coupled to the collector of the first NPN bipolar transistor element Q1 and senses RF output conditions. The ground connection node GCN is coupled to ground. The feedback and bias output FBBIASOUT is coupled to and provides bias and feedback to the base of the second NPN bipolar transistor element Q2. The bias may be used to regulate bias current in the second NPN bipolar transistor element Q2.

The first NPN bipolar transistor element Q1 and the second NPN bipolar transistor element Q2 amplify the RF input signal $RF_{IN}$ to provide the RF output signal $RF_{OUT}$. The DC supply $V_{DCSUPPLY}$ may be a five volt DC supply, a three volt DC supply, or a DC supply of another voltage. In one embodiment of the present invention, the voltage provided by the DC supply $V_{DCSUPPLY}$ may be less than or equal to about five volts. In an alternate embodiment of the present invention, the voltage provided by the DC supply $V_{DCSUPPLY}$ may be less than or equal to about three volts. In one embodiment of the present invention, the bias sense input BIASSENSE is coupled directly to the emitter of the first NPN bipolar transistor element Q1. In an alternate embodiment of the present invention, some circuitry (not shown) is coupled between the bias sense input BIASSENSE and the emitter of the first NPN bipolar transistor element Q1. In one embodiment of the present invention, the base of the first NPN bipolar transistor element Q1 is coupled directly to the emitter of the second NPN bipolar transistor element Q2. In an alternate embodiment of the present invention, some circuitry (not shown) is coupled between the base of the first NPN bipolar transistor element Q1 and the emitter of the second NPN bipolar transistor element Q2.

Figure 3:
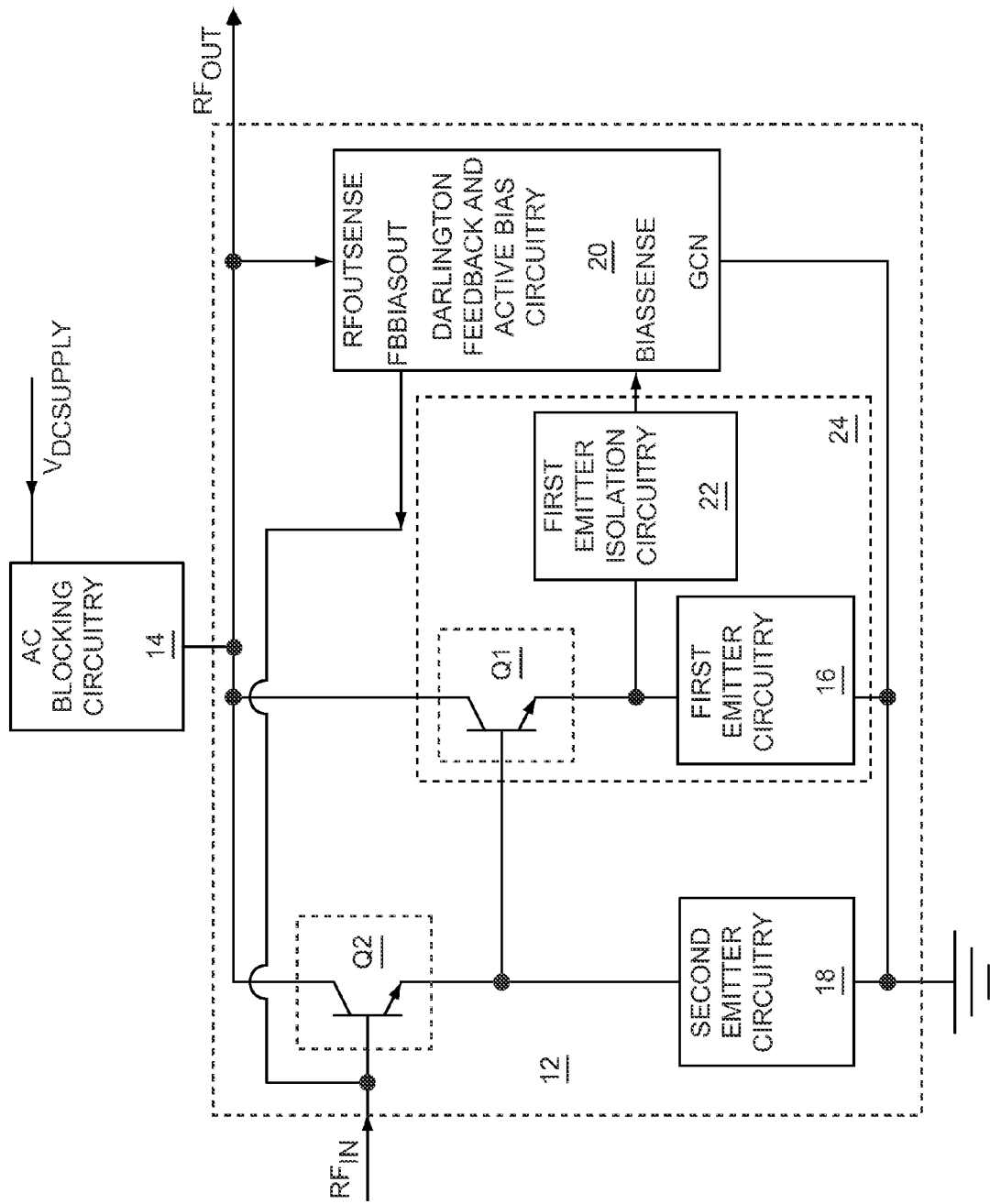
FIG. 3 shows first emitter isolation circuitry added to the active bias Darlington pair amplifier illustrated in FIG. 2.

FIG. 3 shows first emitter isolation circuitry 22 added to the active bias Darlington pair amplifier 12 illustrated in FIG. 2. The first emitter isolation circuitry 22 is coupled between the bias sense input BIASSENSE and the emitter of the first NPN bipolar transistor element Q1. The first NPN bipolar transistor element Q1, the first emitter circuitry 16, and the first emitter isolation circuitry 22 form a first output circuit 24.

Figure 4:
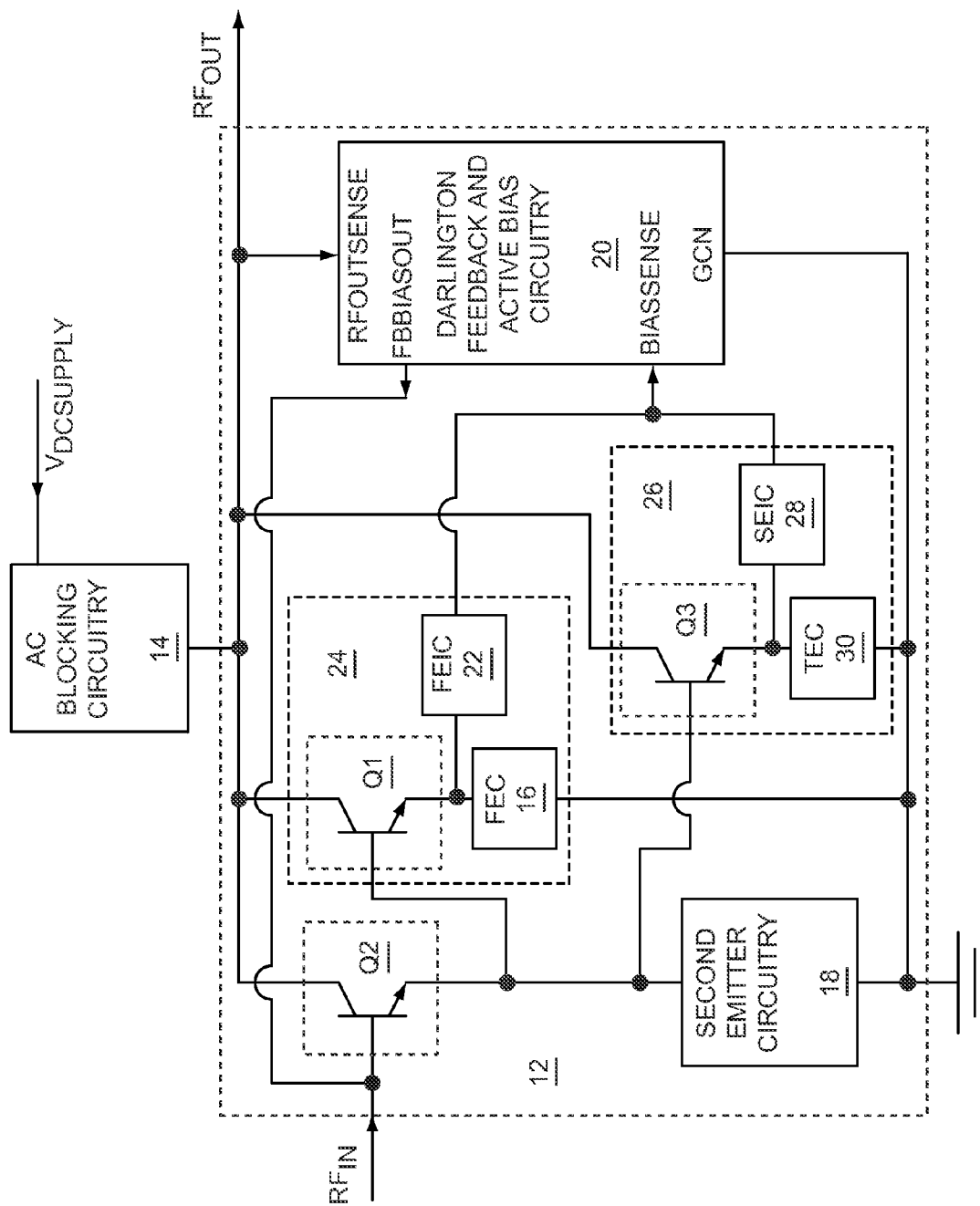
FIG. 4 shows a second output circuit added to the active bias Darlington pair amplifier illustrated in FIG. 3, according to one embodiment of the present invention.

FIG. 4 shows a second output circuit 26 added to the active bias Darlington pair amplifier 12 illustrated in FIG. 3, according to one embodiment of the present invention. The second output circuit 26 is coupled in parallel with the first output circuit 24. The second output circuit 26 includes a third NPN bipolar transistor element Q3, second emitter isolation circuitry 28, and third emitter circuitry 30. The collector of the third NPN bipolar transistor element Q3 is coupled to the collector of the first NPN bipolar transistor element Q1. The base of the third NPN bipolar transistor element Q3 is coupled to the base of the first NPN bipolar transistor element Q1. The second emitter isolation circuitry 28 is coupled between the bias sense input BIASSENSE and the emitter of the third NPN bipolar transistor element Q3. The third emitter circuitry 30 is coupled between the emitter of the third NPN bipolar transistor element Q3 and ground. The addition of the second output circuit 26 may increase the output capacity of the active bias Darlington pair amplifier 12. Alternate embodiments of the present invention may use three or more output circuits 24, 26 coupled in parallel.

Figure 5:
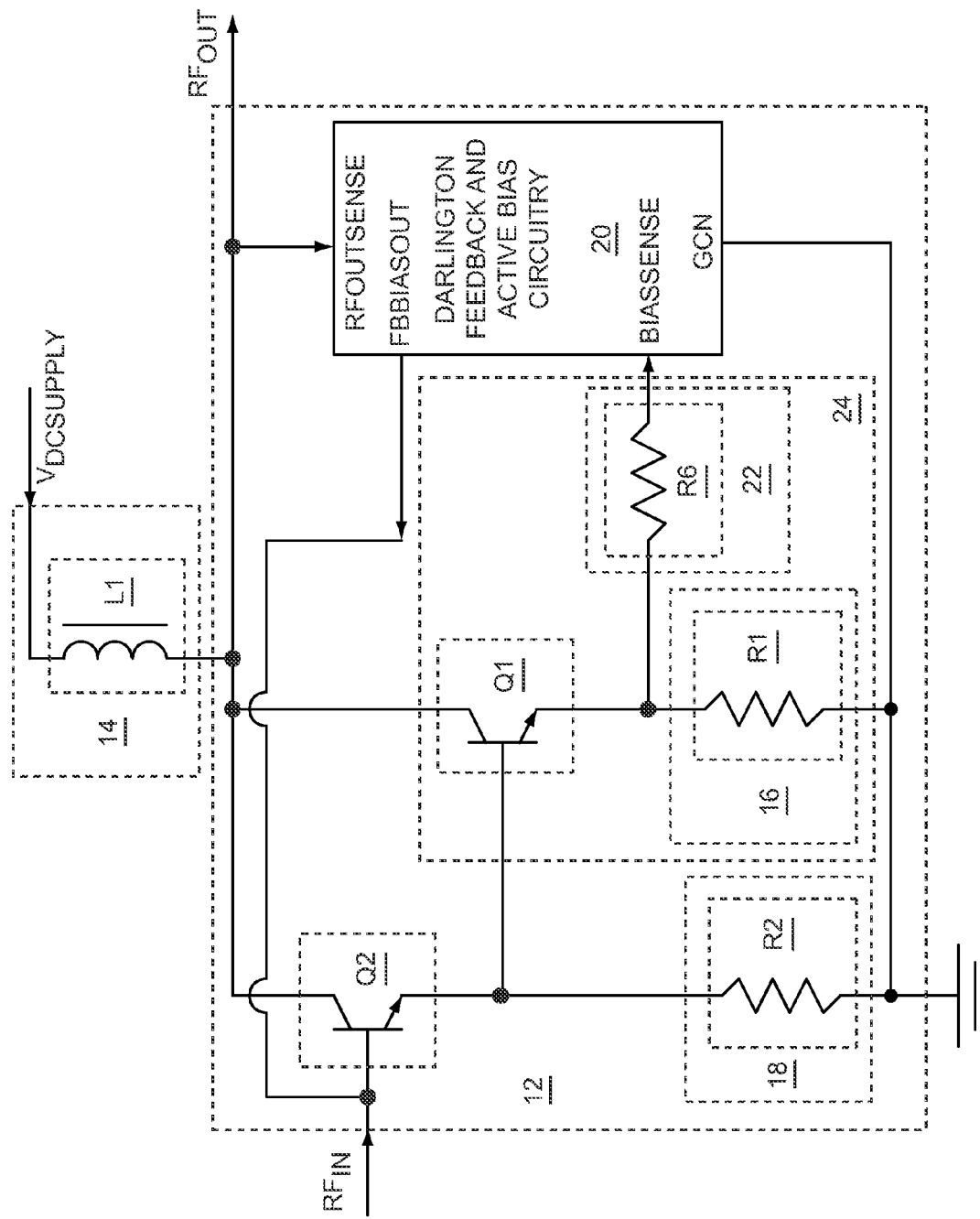
FIG. 5 shows details of alternating current (AC) blocking circuitry, first emitter circuitry, second emitter circuitry, and first emitter isolation circuitry illustrated in FIG. 3, according to one embodiment of the present invention.

FIG. 5 shows details of the AC blocking circuitry 14, the first emitter circuitry 16, the second emitter circuitry 18, and the first emitter isolation circuitry 22, illustrated in FIG. 3, according to one embodiment of the present invention. The first emitter circuitry 16 includes the first resistive element R1, the second emitter circuitry 18 includes the second resistive element R2, the first emitter isolation circuitry 22 includes a sixth resistive element R6, and the AC blocking circuitry 14 includes the first inductive element L1.

Figure 6:
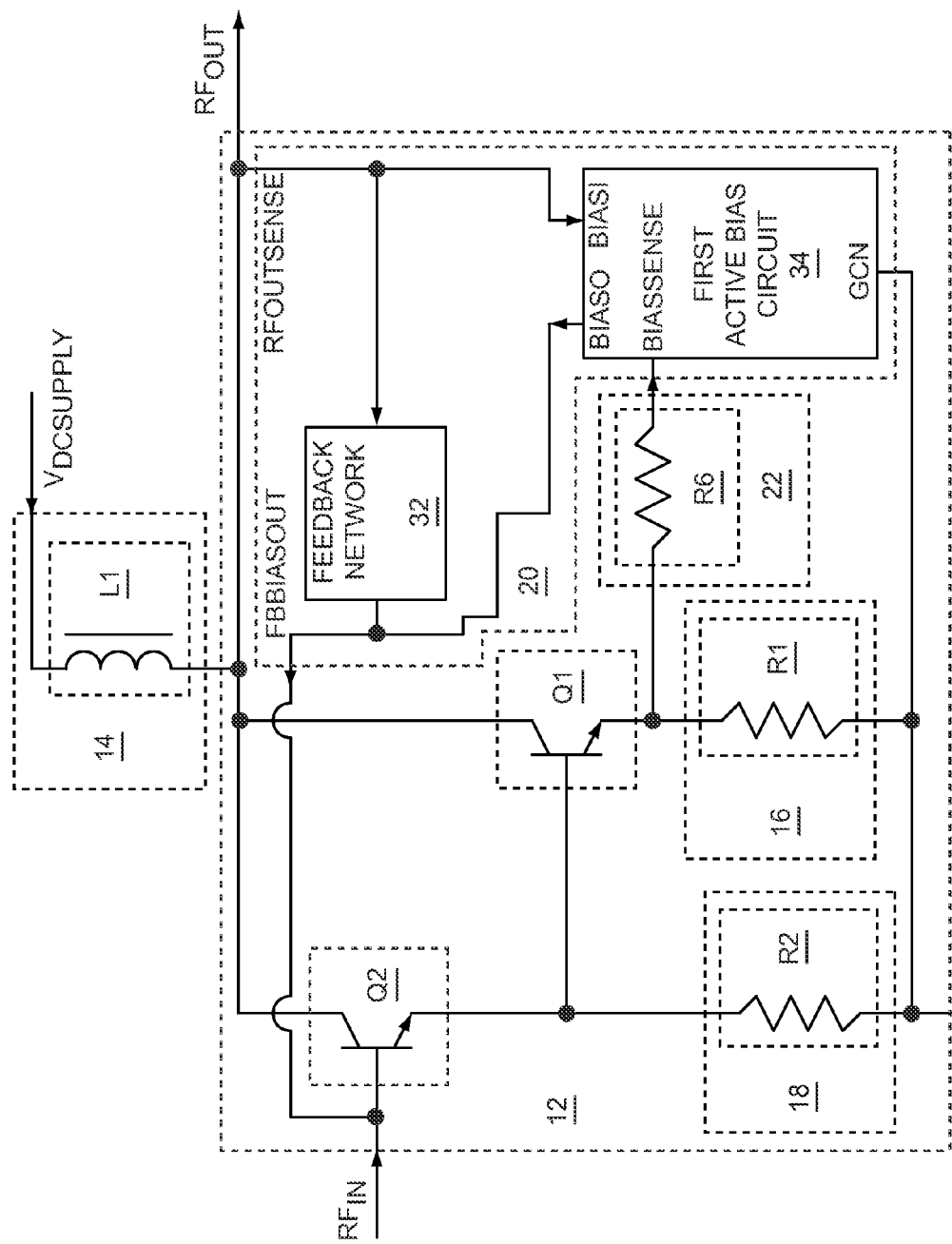
FIG. 6 shows details of Darlington feedback and active bias circuitry illustrated in FIG. 5, according to one embodiment of the Darlington feedback and active bias circuitry.

FIG. 6 shows details of the Darlington feedback and active bias circuitry 20 illustrated in FIG. 5, according to one embodiment of the Darlington feedback and active bias circuitry 20. The Darlington feedback and active bias circuitry 20 includes a feedback network 32 coupled between the feedback and bias output FBBIASOUT RF and the output sense input RFOUTSENSE. Additionally, the Darlington feedback and active bias circuitry 20 includes a first active bias circuit 34, which provides the bias sense input BIASSENSE and the ground connection node GCN. The first active bias circuit 34 includes a bias input BIASI, which is coupled to the RF output sense input RFOUTSENSE and a bias output BIASO, which is coupled to the feedback and bias output FBBIASOUT. The feedback network 32 provides feedback to the second NPN bipolar transistor element Q2.

Figure 7:
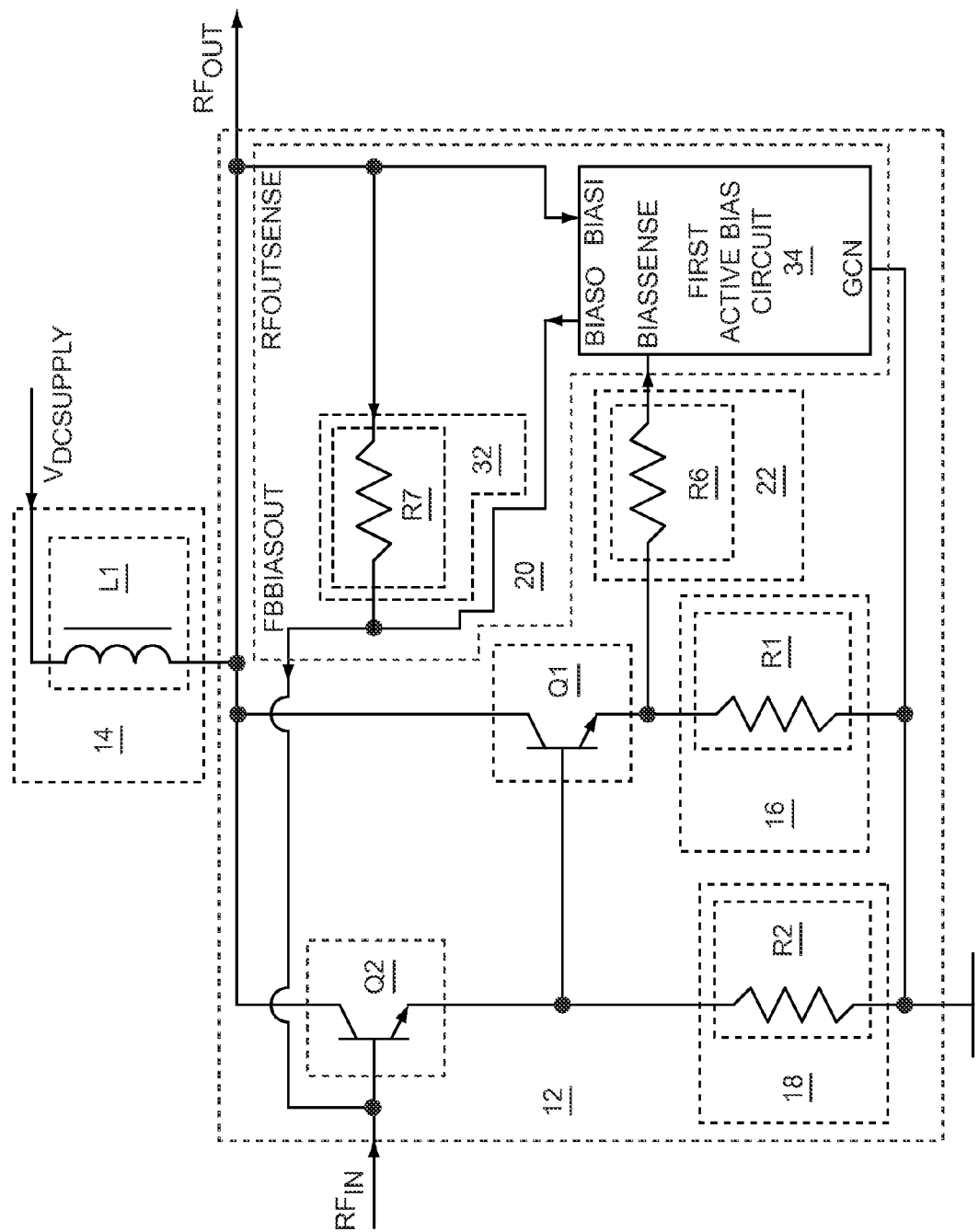
FIG. 7 shows details of the feedback network illustrated in FIG. 6, according to one embodiment of the Darlington feedback and active bias circuitry.
Figure 8:
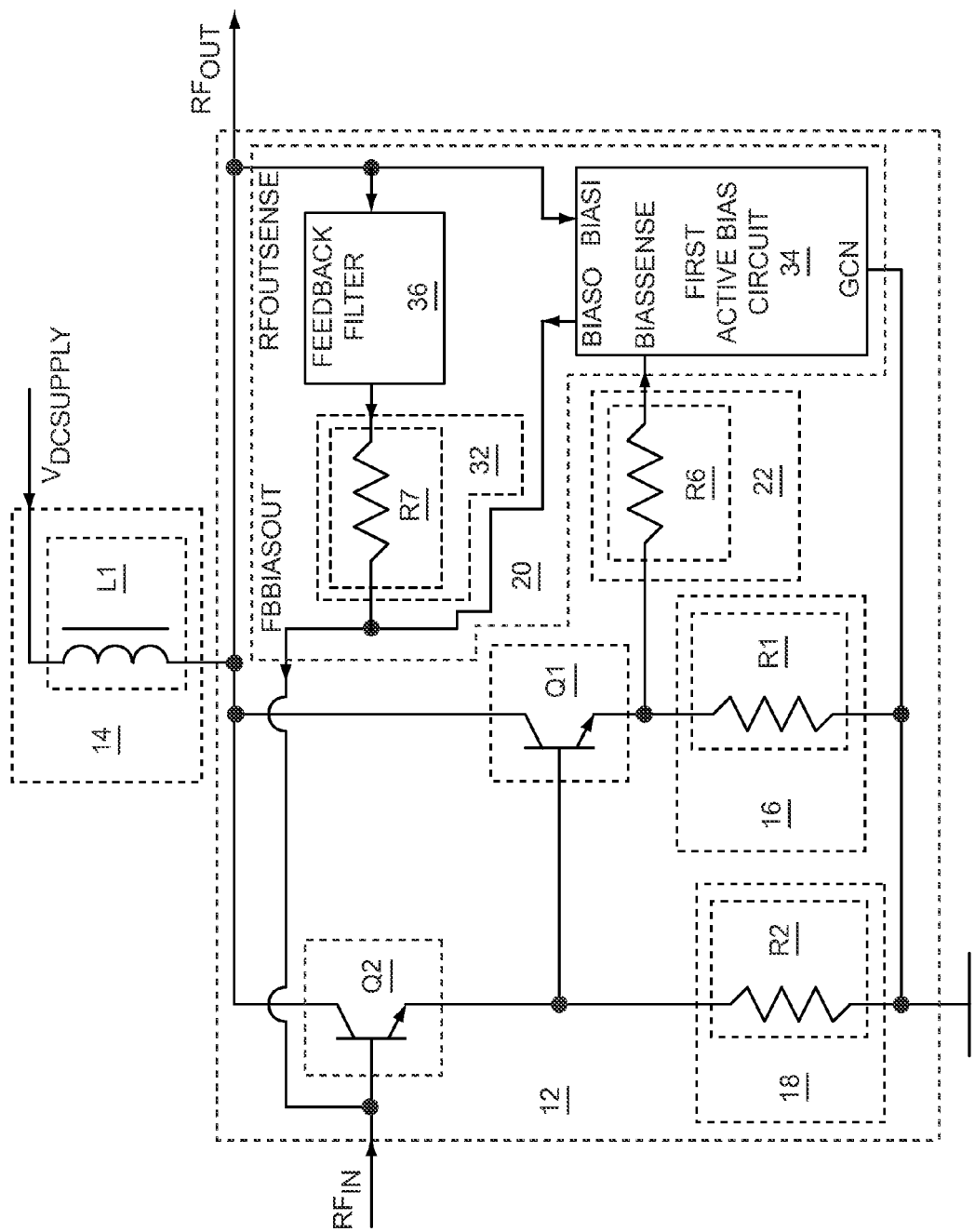
FIG. 8 shows a feedback filter added to the Darlington feedback and active bias circuitry illustrated in FIG. 7, according to an alternate embodiment of the Darlington feedback and active bias circuitry.

FIG. 7 shows details of the feedback network 32 illustrated in FIG. 6, according to one embodiment of the Darlington feedback and active bias circuitry 20. The feedback network 32 includes a seventh resistive element R7. FIG. 8 shows a feedback filter 36 added to the Darlington feedback and active bias circuitry 20 illustrated in FIG. 7, according to an alternate embodiment of the Darlington feedback and active bias circuitry 20. The feedback filter 36 is coupled between the feedback network 32 and the RF output sense input RFOUTSENSE. The feedback network 32 provides feedback to the second NPN bipolar transistor element Q2 and the feedback filter 36 provides frequency dependent feedback to the second NPN bipolar transistor element Q2.

Figure 9:
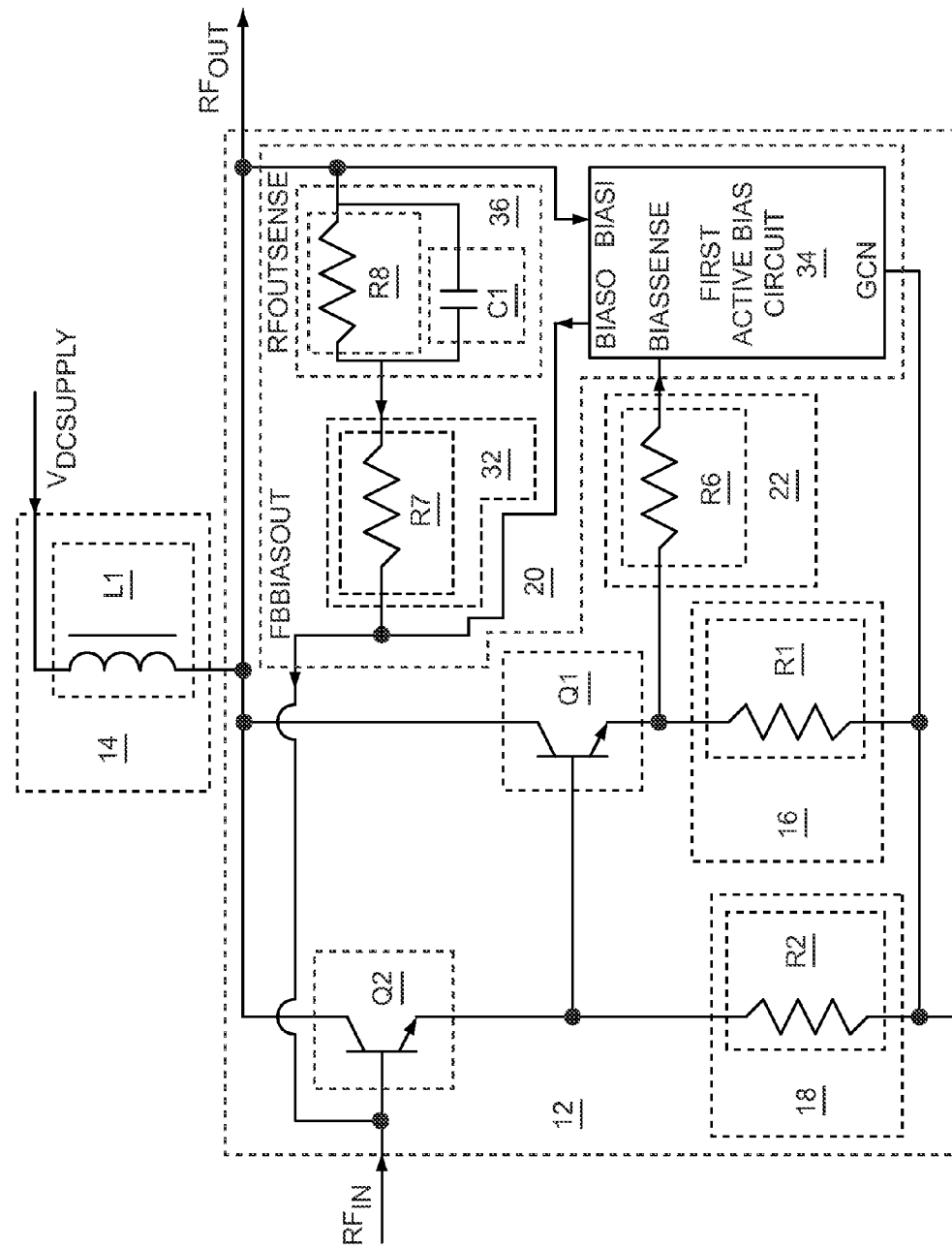
FIG. 9 shows details of a feedback filter illustrated in FIG. 8, according to one embodiment of the Darlington feedback and active bias circuitry 20.

FIG. 9 shows details of the feedback filter 36 illustrated in FIG. 8, according to one embodiment of the Darlington feedback and active bias circuitry 20. The feedback filter 36 includes an eighth resistive element R8 coupled in parallel with a first capacitive element C1. The first capacitive element C1 may provide a low impedance relative to the resistance of the eighth resistive element R8 at frequencies associated with the RF output signal $RF_{OUT}$. Therefore, DC feedback may be provided primarily by the seventh and eighth resistive elements R7, R8 and RF feedback may be provided primarily by the seventh resistive element R7.

Figure 10:
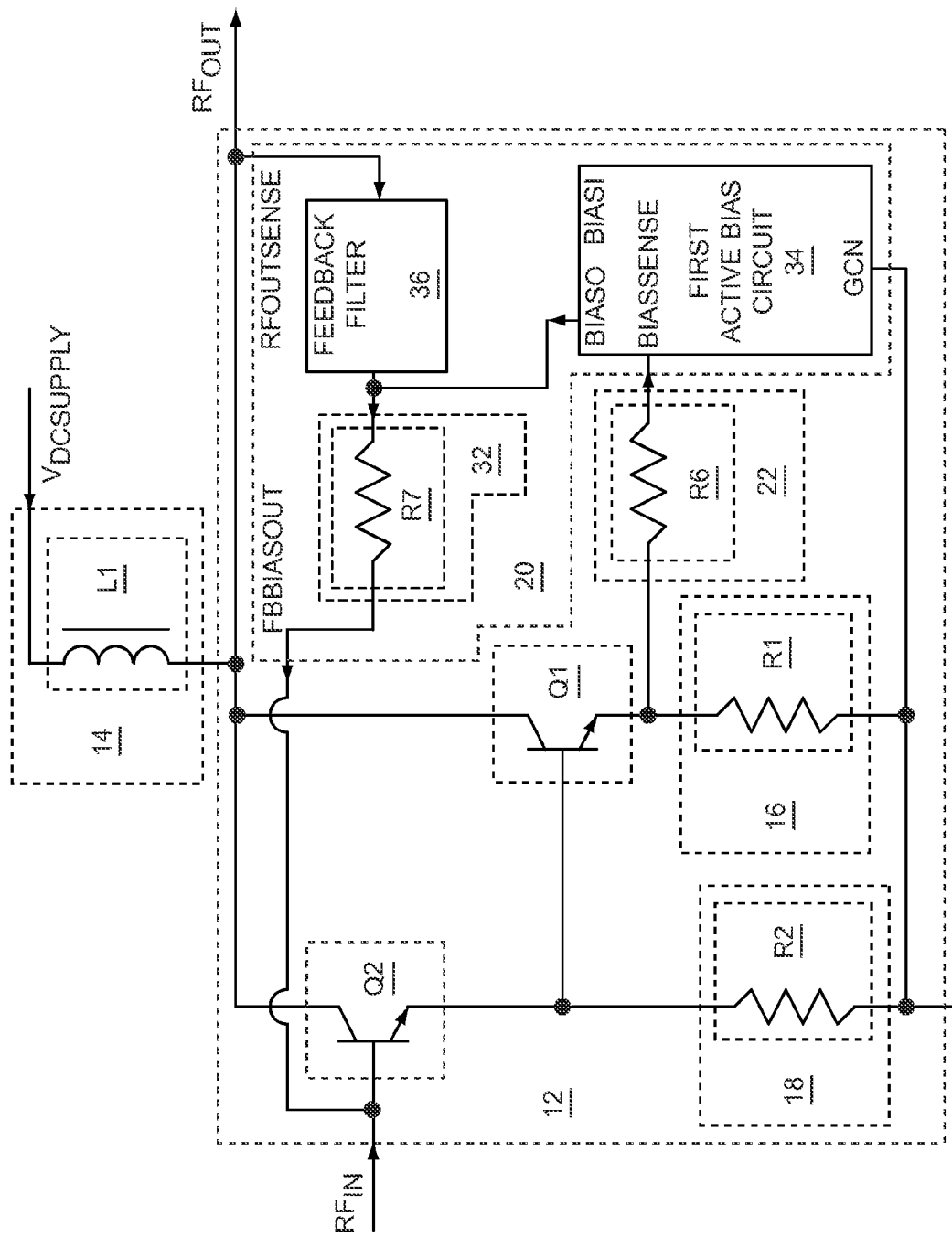
FIG. 10 shows the feedback filter added to the Darlington feedback and active bias circuitry illustrated in FIG. 7, according to an additional embodiment of the Darlington feedback and active bias circuitry.

FIG. 10 shows the feedback filter 36 added to the Darlington feedback and active bias circuitry 20 illustrated in FIG. 7, according to an additional embodiment of the Darlington feedback and active bias circuitry 20. The feedback filter 36 is coupled between the feedback network 32 and the RF output sense input RFOUTSENSE. The feedback network 32 provides feedback to the second NPN bipolar transistor element Q2 and the feedback filter 36 provides frequency dependent feedback to the second NPN bipolar transistor element Q2. Instead of being coupled to the RF output sense input RFOUTSENSE, the bias input BIASI is left open. Instead of being coupled to the feedback and bias output FBBIASOUT, the bias output BIASO is coupled to a common node that couples the feedback filter 36 to the feedback network 32.

Figure 11:
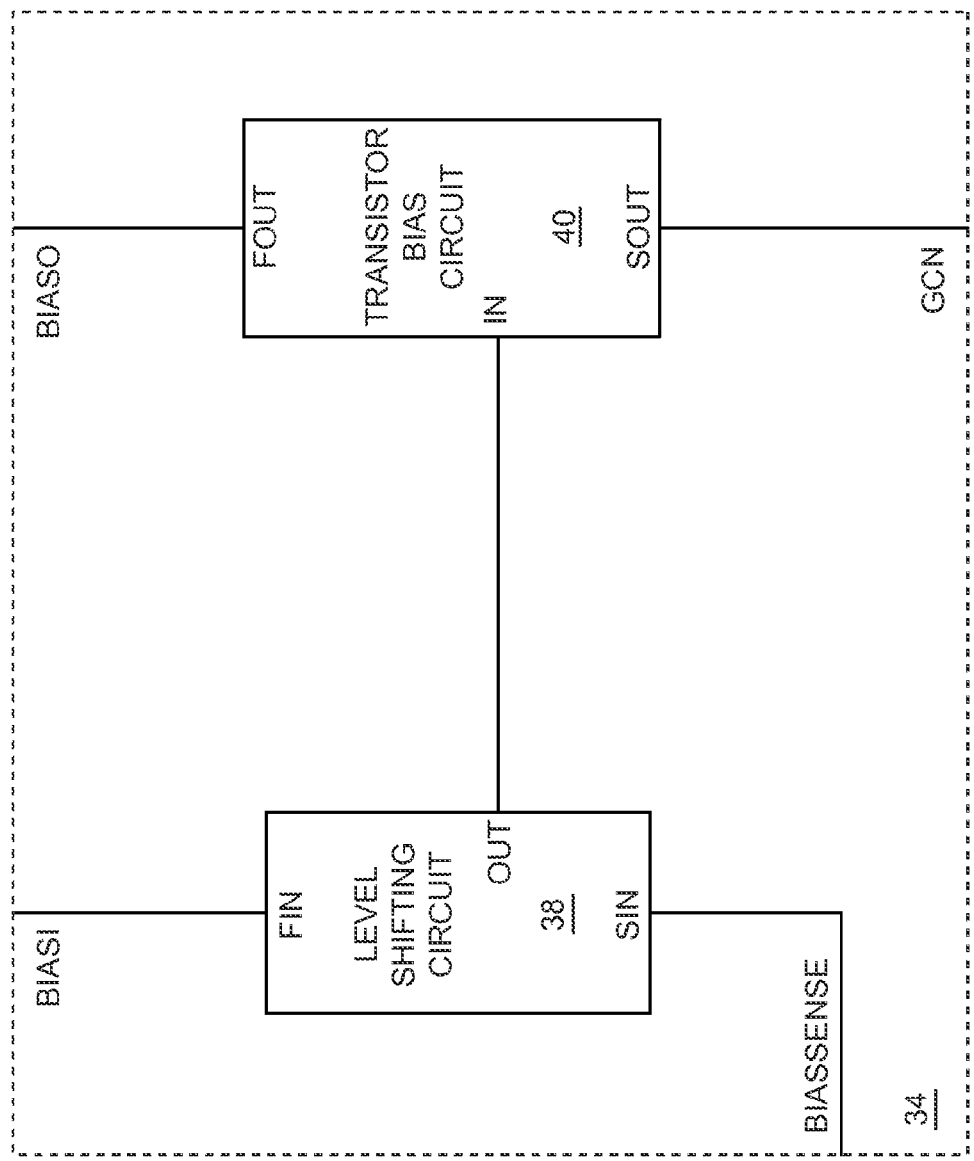
FIG. 11 shows details of a first active bias circuit illustrated in FIG. 6, according to one embodiment of the first active bias circuit.

FIG. 11 shows details of the first active bias circuit 34 illustrated in FIG. 6, according to one embodiment of the first active bias circuit 34. The first active bias circuit 34 includes a level shifting circuit 38 and a transistor bias circuit 40. The level shifting circuit 38 includes a first input FIN coupled to the bias input BIASI, a second input SIN coupled to the bias sense input BIASSENSE, and an output OUT. The transistor bias circuit 40 has a first output FOUT coupled to the bias output BIASO, a second output SOUT coupled to the ground connection node GCN, and an input IN coupled to the output OUT. The level shifting circuit 38 receives and level-shifts the signal at the bias sense input BIASSENSE to provide a level-shifted signal to the input IN that is indicative of bias conditions. The transistor bias circuit 40 provides an active bias signal from the first output FOUT based on the level-shifted signal. In one embodiment of the present invention, the ground connection node GCN may be coupled to a DC reference instead of ground. The active bias signal from the first output FOUT may be based on the level-shifted signal and the DC reference. In one embodiment of the first active bias circuit 34, the output OUT is coupled directly to the input IN. In an alternate embodiment of the first active bias circuit 34, some circuitry (not shown) is coupled between the output OUT and the input IN.

Figure 12:
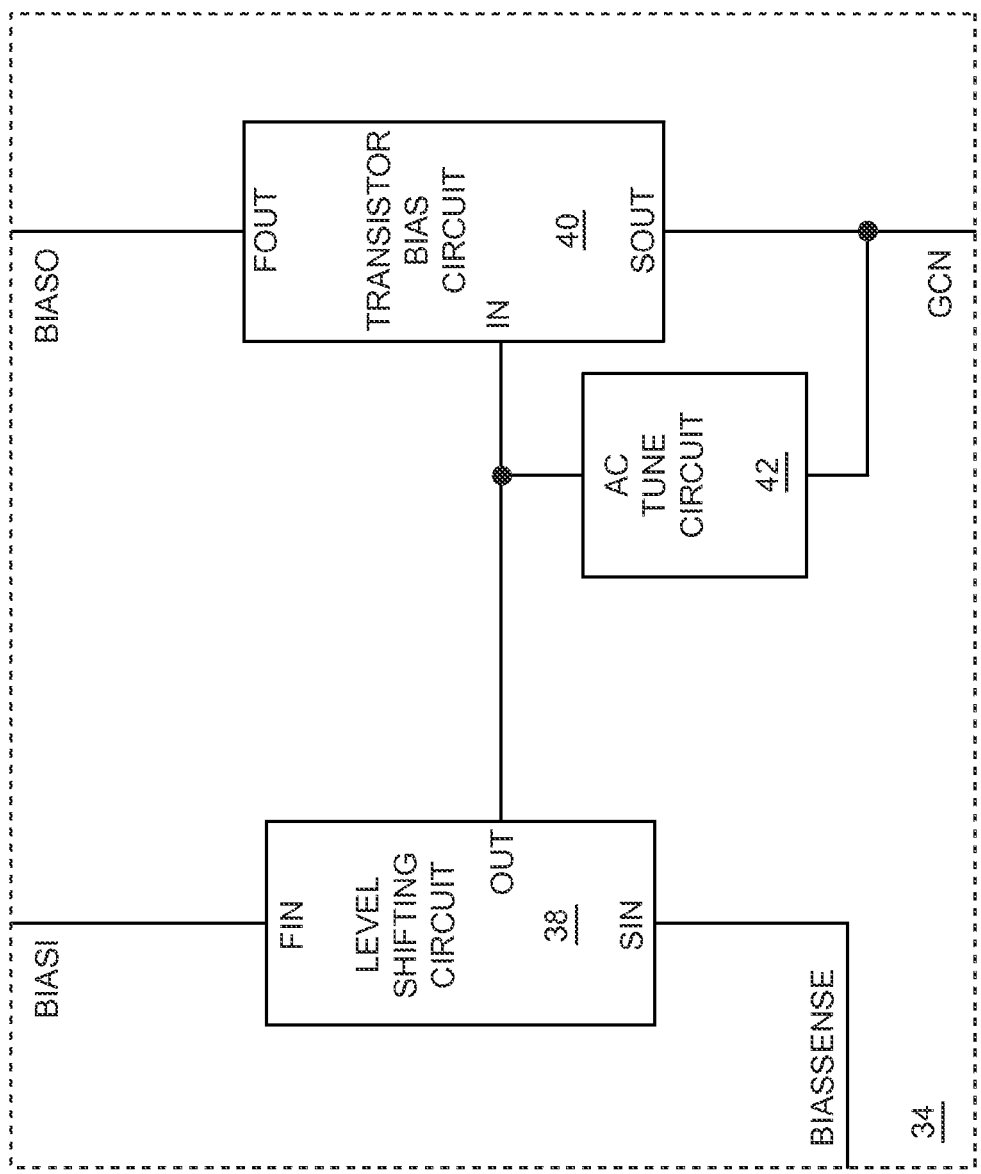
FIG. 12 shows an AC tune circuit added to the first active bias circuit illustrated in FIG. 11, according to an alternate embodiment of the first active bias circuit.

FIG. 12 shows an AC tune circuit 42 added to the first active bias circuit 34 illustrated in FIG. 11, according to an alternate embodiment of the first active bias circuit 34. The AC tune circuit 42 is coupled between the ground connection node GCN and the input IN. Therefore, the bias signal from the first output FOUT may be further based on the RF output signal $RF_{OUT}$ (FIG. 6). The AC tune circuit 42 may be used to adjust bias under certain RF drive conditions.

Figure 13:
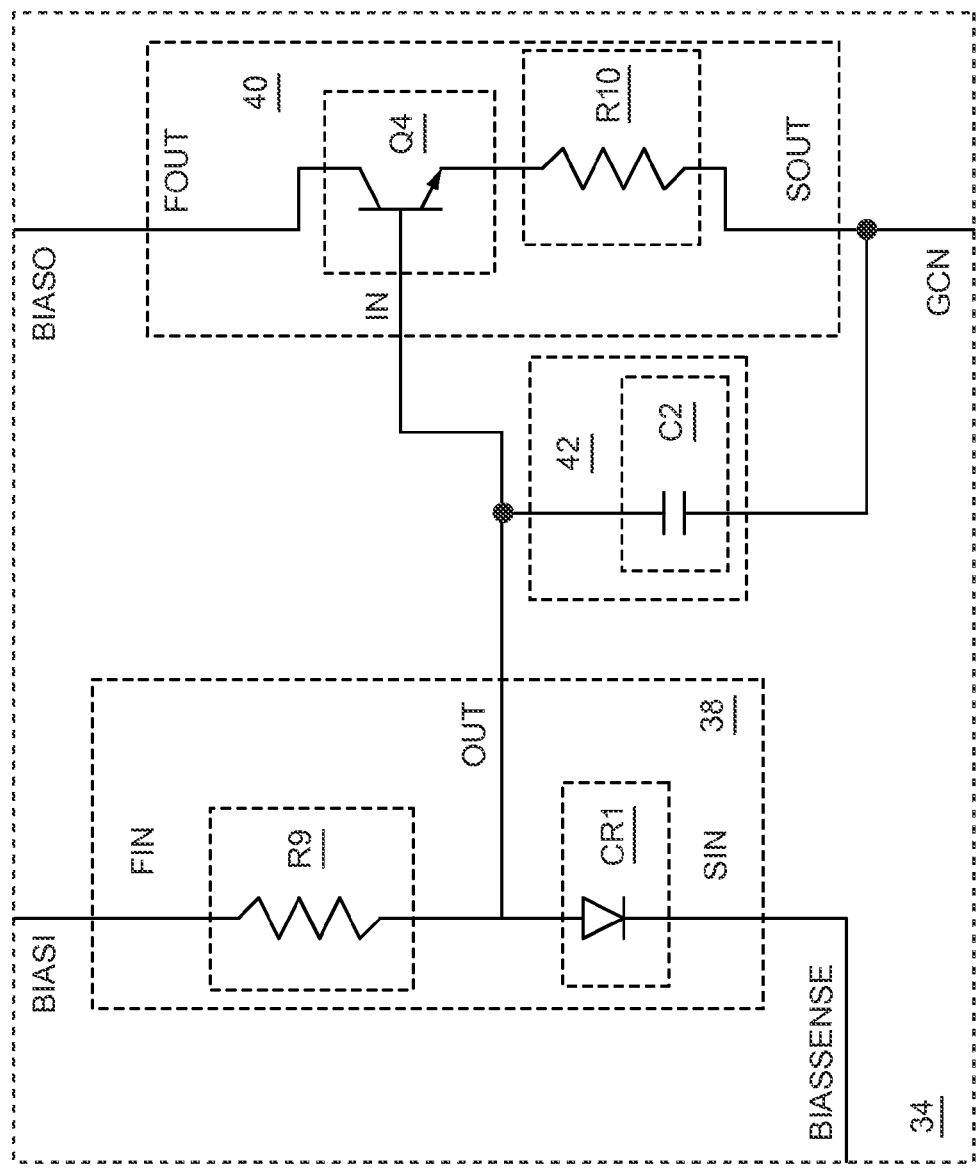
FIG. 13 shows details of the level shifting circuit, the transistor bias circuit, and the AC tune circuit illustrated in FIG. 12, according to one embodiment of the first active bias circuit.

FIG. 13 shows details of the level shifting circuit 38, the transistor bias circuit 40, and the AC tune circuit 42 illustrated in FIG. 12, according to one embodiment of the first active bias circuit 34. The level shifting circuit 38 includes a ninth resistive element R9 coupled between the first input FIN and the output OUT, and a first diode element CR1 coupled between the second input SIN and the output OUT. The cathode of the first diode element CR1 is coupled to the second input SIN and the anode of the first diode element CR1 is coupled to the output OUT. The transistor bias circuit 40 includes a fourth NPN bipolar transistor element Q4 and a tenth resistive element R10 coupled between the second output SOUT and the emitter of the fourth NPN bipolar transistor element Q4. The base of the fourth NPN bipolar transistor element Q4 is coupled to the input IN and the collector of the fourth NPN bipolar transistor element Q4 is coupled to the first output FOUT. The AC tune circuit 42 includes a second capacitive element C2. In an exemplary embodiment of the present invention, the active bias Darlington pair amplifier 12 illustrated in FIG. 9 includes the first active bias circuit 34 illustrated in FIG. 13.

Figure 14:
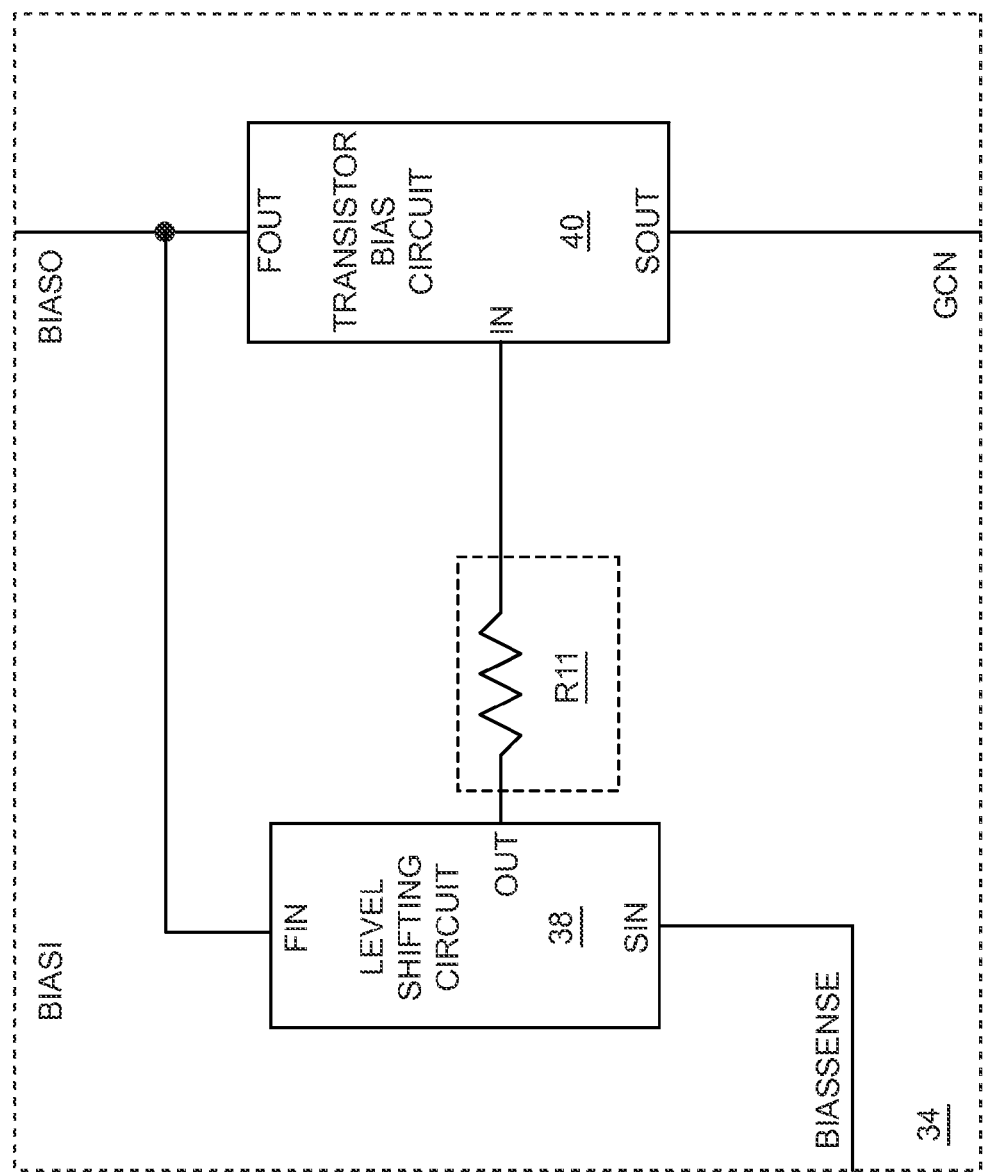
FIG. 14 shows details of the first active bias circuit illustrated in FIG. 10, according to an additional embodiment of the first active bias circuit.

FIG. 14 shows details of the first active bias circuit 34 illustrated in FIG. 10, according to an additional embodiment of the first active bias circuit 34. Instead of being coupled to the bias input BIASI, the first input FIN is coupled to the bias output BIASO. An eleventh resistive element R11 is coupled between the input IN and the output OUT.

Figure 15:
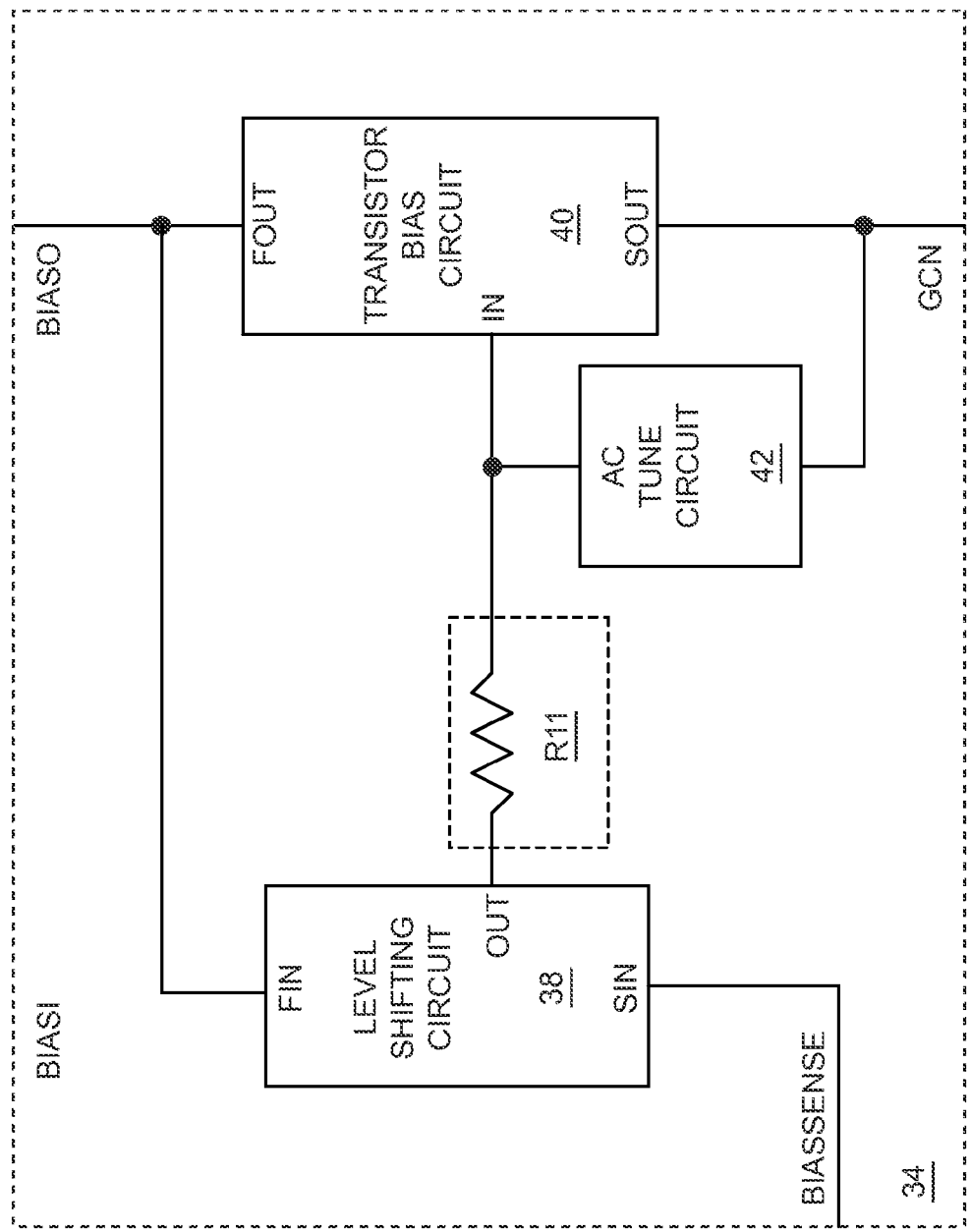
FIG. 15 shows the AC tune circuit added to the first active bias circuit illustrated in FIG. 14, according to another embodiment of the first active bias circuit.

FIG. 15 shows the AC tune circuit 42 added to the first active bias circuit 34 illustrated in FIG. 14, according to another embodiment of the first active bias circuit 34. The AC tune circuit 42 is coupled between the ground connection node GCN and the input IN. Therefore, the bias signal from the first output FOUT may be further based on the RF output signal $RF_{OUT}$ (FIG. 10). The AC tune circuit 42 may be used to adjust bias under certain RF drive conditions.

Figure 16:
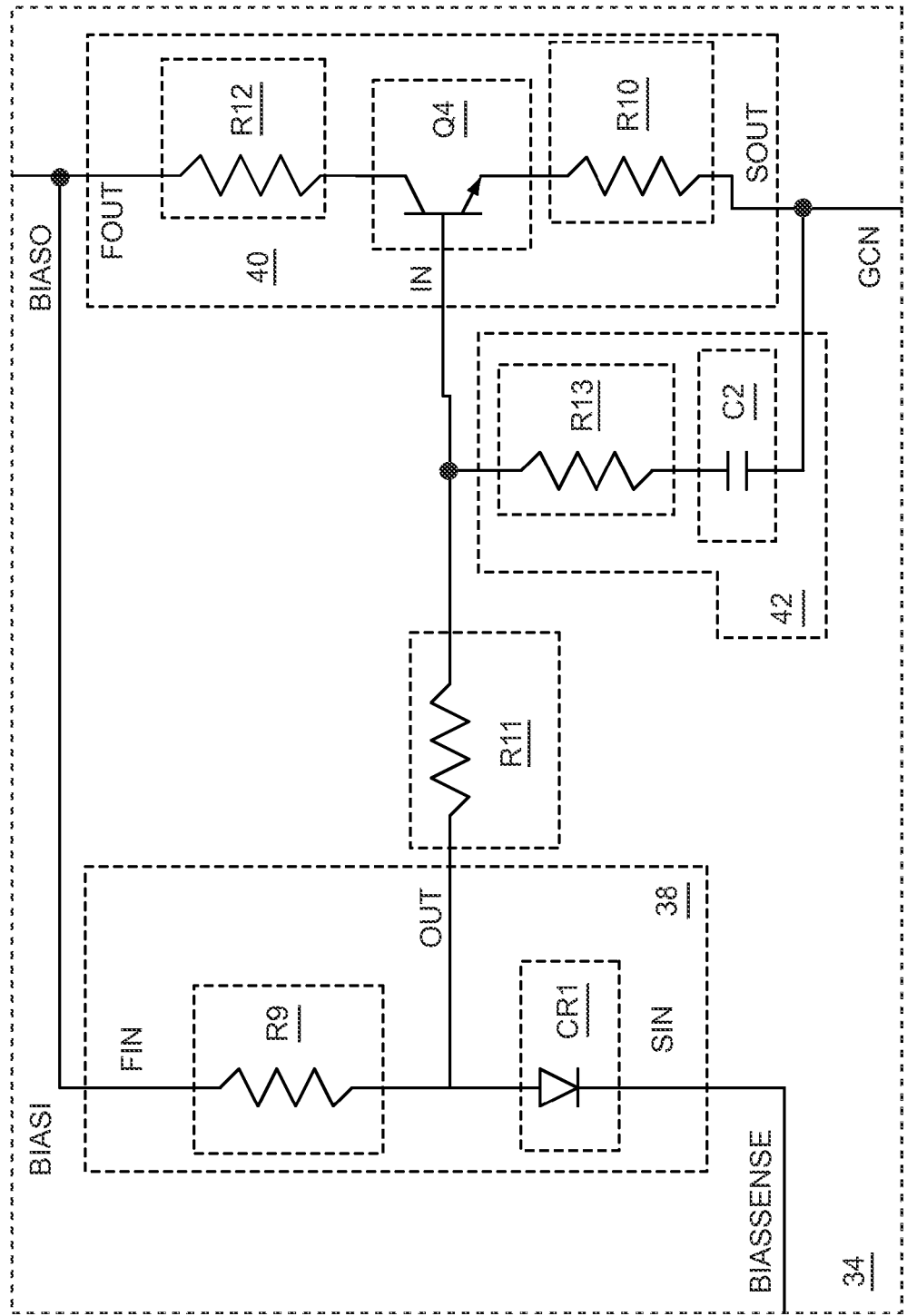
FIG. 16 shows details of the level shifting circuit, the transistor bias circuit, and the AC tune circuit illustrated in FIG. 15, according to one embodiment of the first active bias circuit.

FIG. 16 shows details of the level shifting circuit 38, the transistor bias circuit 40, and the AC tune circuit 42 illustrated in FIG. 15, according to one embodiment of the first active bias circuit 34. The level shifting circuit 38 includes the ninth resistive element R9 coupled between the first input FIN and the output OUT, and the first diode element CR1 coupled between the second input SIN and the output OUT. The cathode of the first diode element CR1 is coupled to the second input SIN and the anode of the first diode element CR1 is coupled to the output OUT. The transistor bias circuit 40 includes the fourth NPN bipolar transistor element Q4, the tenth resistive element R10 coupled between the second output SOUT and the emitter of the fourth NPN bipolar transistor element Q4, and a twelfth resistive element R12 coupled between the first output FOUT and the collector of the fourth NPN bipolar transistor element Q4. The base of the fourth NPN bipolar transistor element Q4 is coupled to the input IN. The AC tune circuit 42 includes the second capacitive element C2 coupled in series with a thirteenth resistive element R13.

Figure 17:
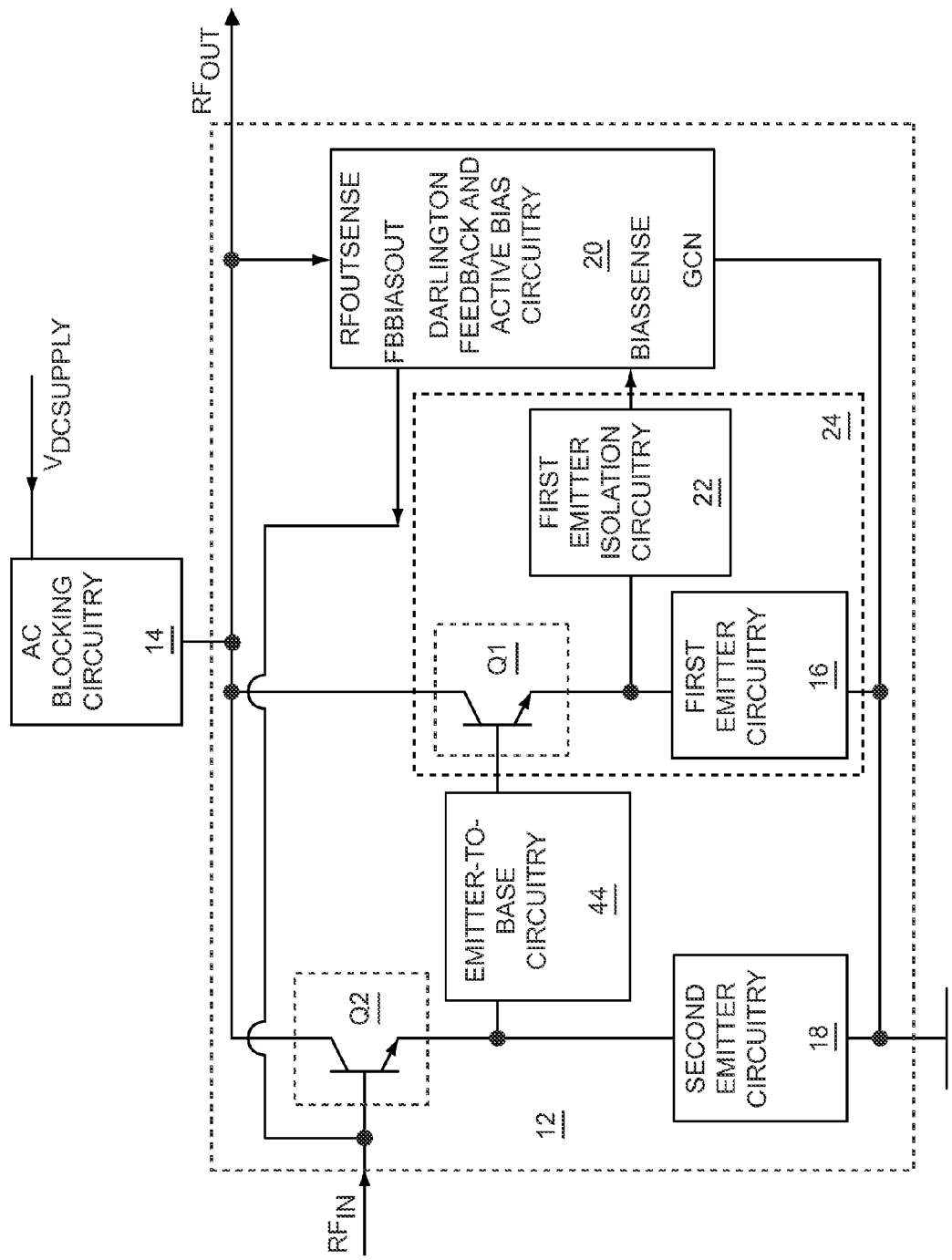
FIG. 17 shows emitter-to-base circuitry added to the active bias Darlington pair amplifier illustrated in FIG. 3, according to one embodiment of the present invention.
Figure 18:
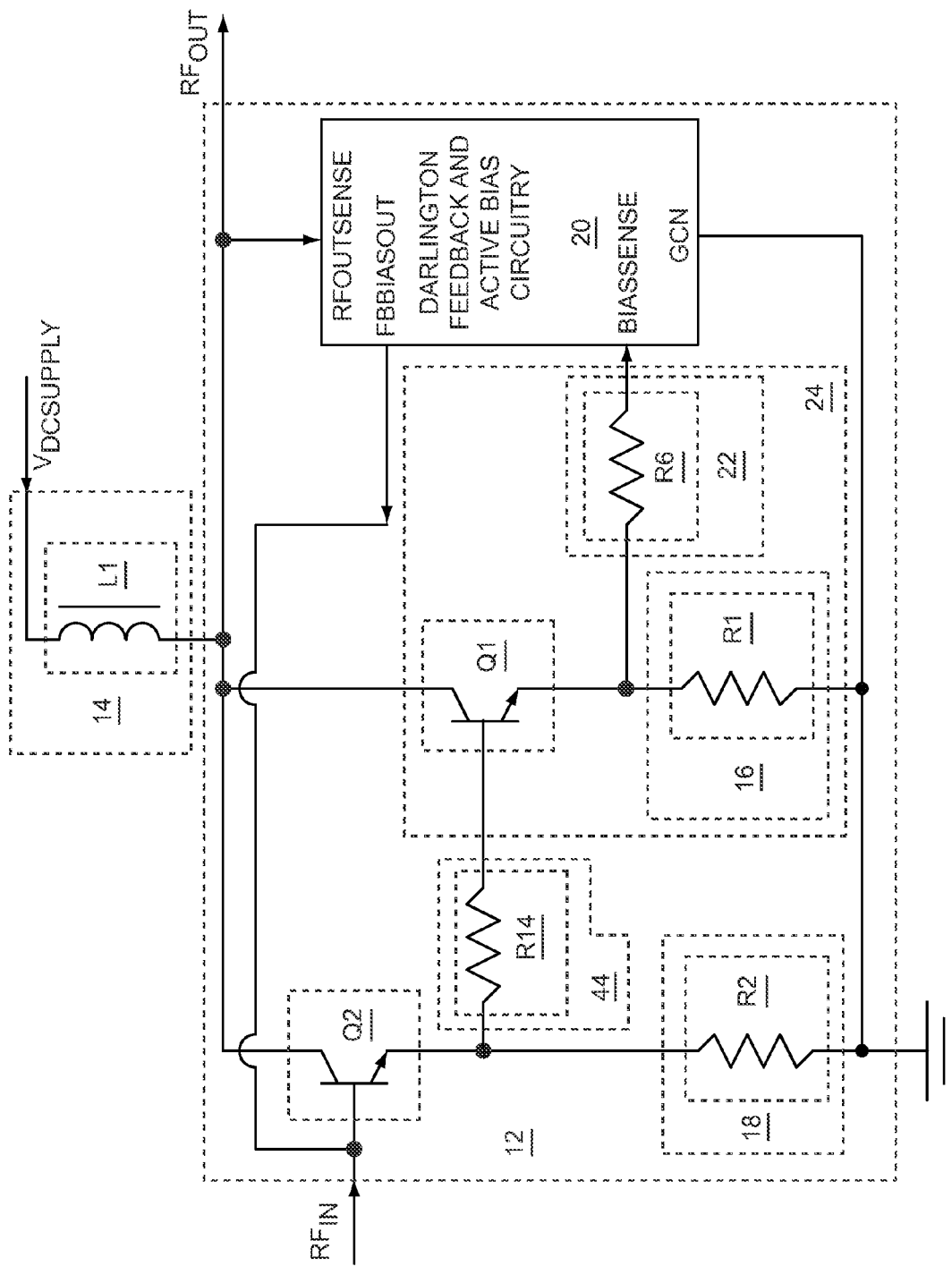
FIG. 18 shows details of the AC blocking circuitry, the first emitter circuitry, the second emitter circuitry, the first emitter isolation circuitry, and the emitter-to-base circuitry illustrated in FIG. 17, according to one embodiment of the present invention.

FIG. 17 shows emitter-to-base circuitry 44 added to the active bias Darlington pair amplifier 12 illustrated in FIG. 3, according to one embodiment of the present invention. The emitter-to-base circuitry 44 is coupled between the base of the first NPN bipolar transistor element Q1 and the emitter of the second NPN bipolar transistor element Q2. FIG. 18 shows details of the AC blocking circuitry 14, the first emitter circuitry 16, the second emitter circuitry 18, the first emitter isolation circuitry 22, and the emitter-to-base circuitry 44 illustrated in FIG. 17, according to one embodiment of the present invention. The first emitter circuitry 16 includes the first resistive element R1, the second emitter circuitry 18 includes the second resistive element R2, the first emitter isolation circuitry 22 includes the sixth resistive element R6, and the AC blocking circuitry 14 includes the first inductive element L1. The emitter-to-base circuitry 44 includes a fourteenth resistive element R14 coupled between the base of the first NPN bipolar transistor element Q1 and the emitter of the second NPN bipolar transistor element Q2.

Figure 19:
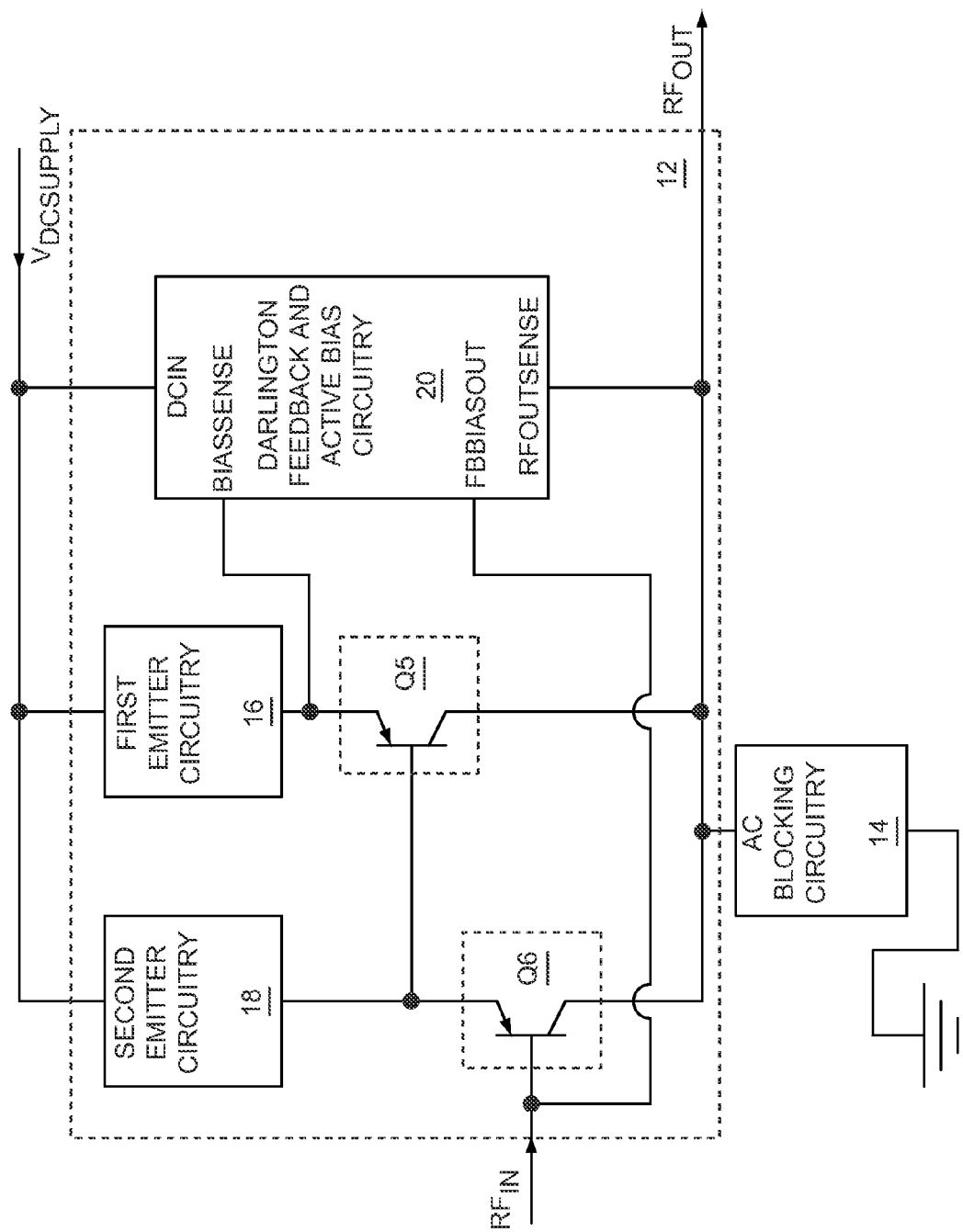
FIG. 19 shows an active bias Darlington pair amplifier based on PNP bipolar transistor elements, according to an alternate embodiment of the present invention.

FIG. 19 shows an active bias Darlington pair amplifier 12 based on PNP bipolar transistor elements, according to an alternate embodiment of the present invention. Referring to the active bias Darlington pair amplifier 12 illustrated in FIG. 2, the first and second NPN bipolar transistor elements Q1, Q2 are replaced with first and second PNP bipolar transistor elements Q5, Q6, respectively. The ground connection node GCN is replaced with a DC input node DCIN, which is coupled to the DC supply $V_{DCSUPPLY}$ instead of being coupled to ground. The AC blocking circuitry 14 is coupled between ground and a collector of the first PNP bipolar transistor element Q5 instead of being coupled between the DC supply $V_{DCSUPPLY}$ and the collector of the first NPN bipolar transistor element Q1.

Figure 20:
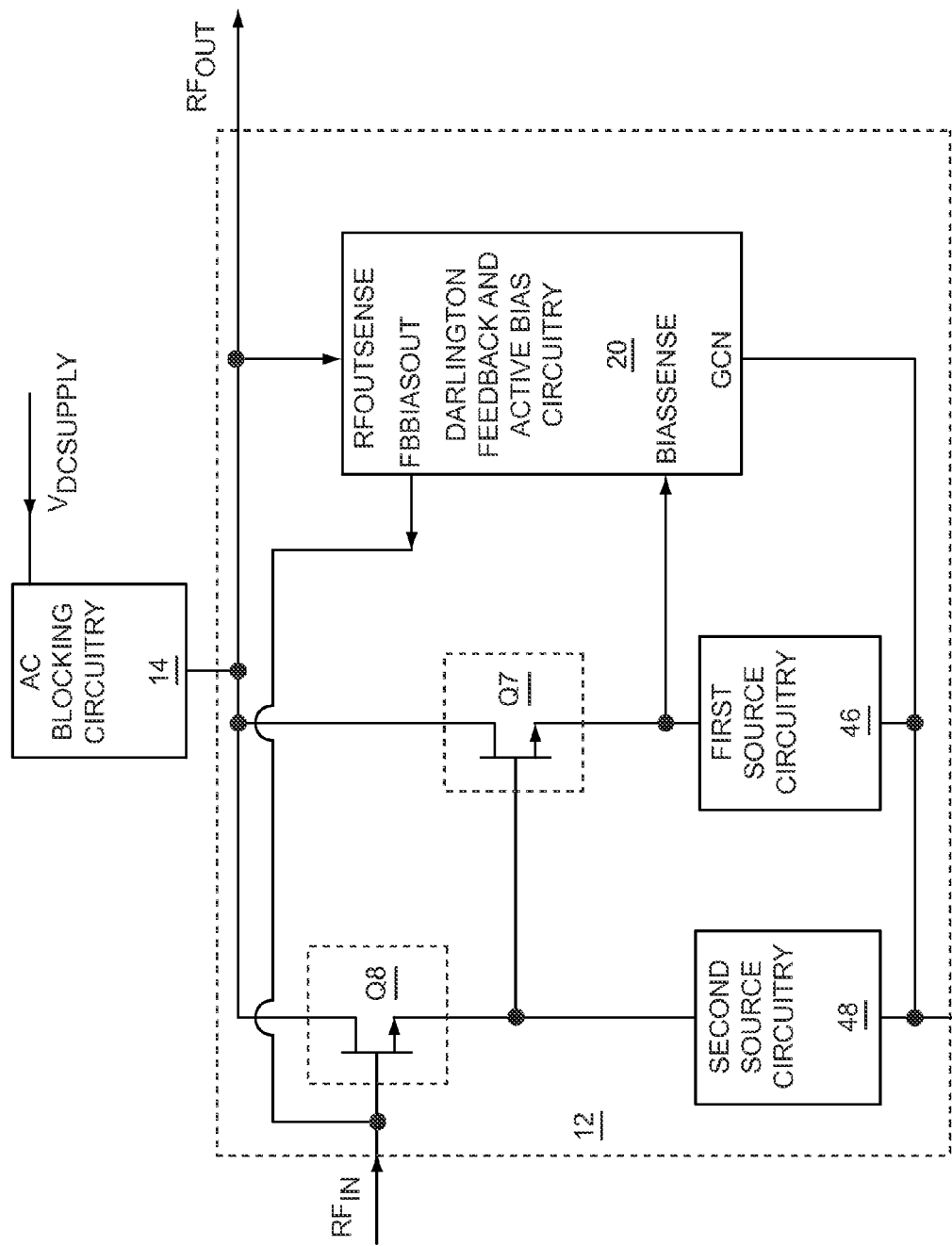
FIG. 20 shows an active bias Darlington pair amplifier based on N-type field effect transistor (FET) elements, according to an additional embodiment of the present invention.

FIG. 20 shows an active bias Darlington pair amplifier 12 based on N-type field effect transistor (FET) elements, according to an additional embodiment of the present invention. Referring to the active bias Darlington pair amplifier 12 illustrated in FIG. 2, the first and second NPN bipolar transistor elements Q1, Q2 are replaced with first and second N-type FET elements Q7, Q8, respectively. The emitters, bases, and collectors of the first and second NPN bipolar transistor elements Q1, Q2 are replaced with sources, gates, and drains of the first and second N-type FET elements Q7, Q8, respectively. The first emitter circuitry 16 is replaced with first source circuitry 46, and second emitter circuitry 18 is replaced with second source circuitry 48.

Figure 21:
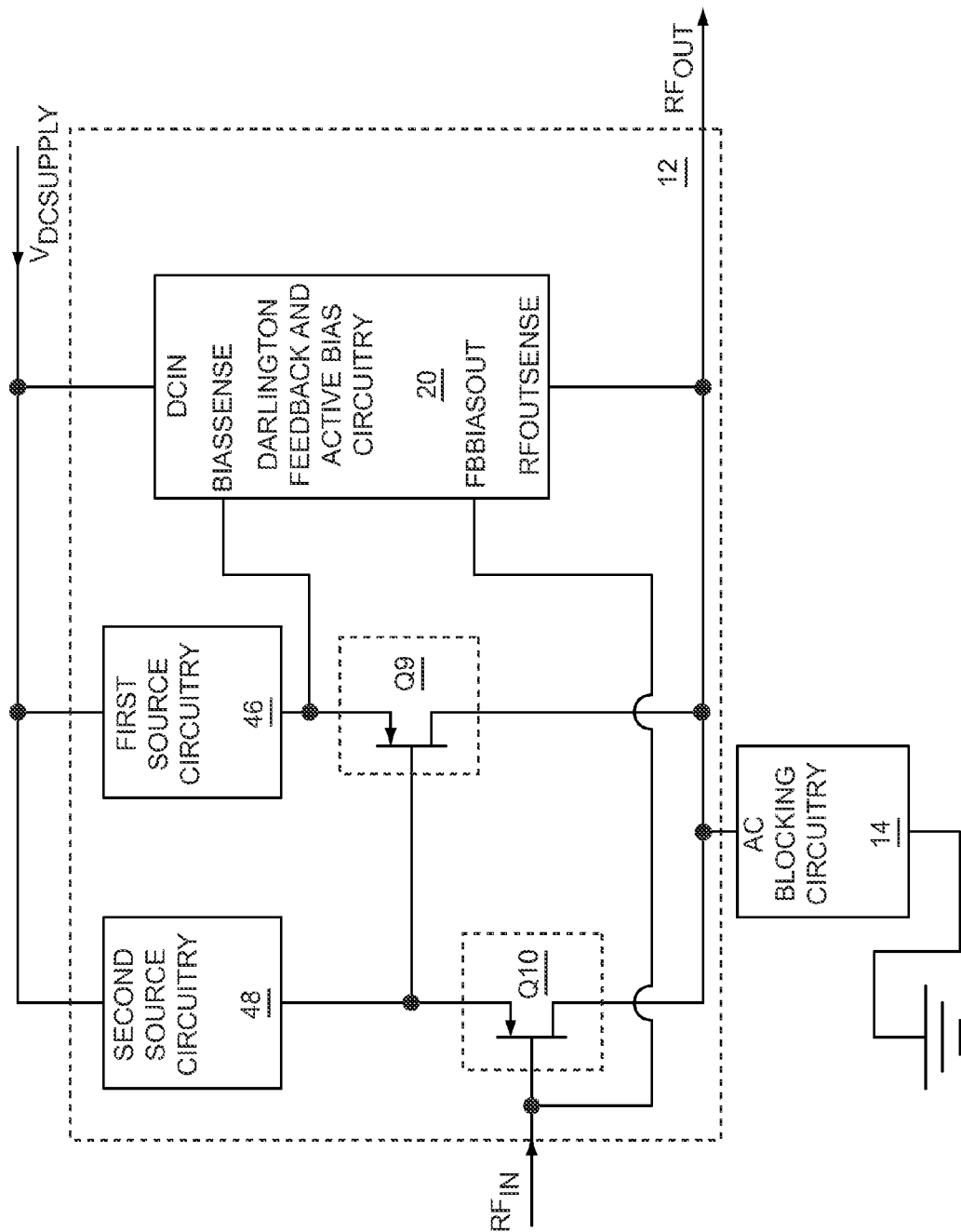
FIG. 21 shows an active bias Darlington pair amplifier based on P-type FET elements, according to another embodiment of the present invention.

FIG. 21 shows an active bias Darlington pair amplifier 12 based on P-type FET elements, according to another embodiment of the present invention. Referring to the active bias Darlington pair amplifier 12 illustrated in FIG. 20, the first and second N-type FET elements Q7, Q8 are replaced with first and second P-type FET elements Q9, Q10, respectively. The ground connection node GCN is replaced with a DC input node DCIN, which is coupled to the DC supply $V_{DCSUPPLY}$ instead of being coupled to ground. The AC blocking circuitry 14 is coupled between ground and a drain of the first P-type FET element Q9 instead of being coupled between the DC supply $V_{DCSUPPLY}$ and the drain of the first N-type FET element Q7.

Figure 22:
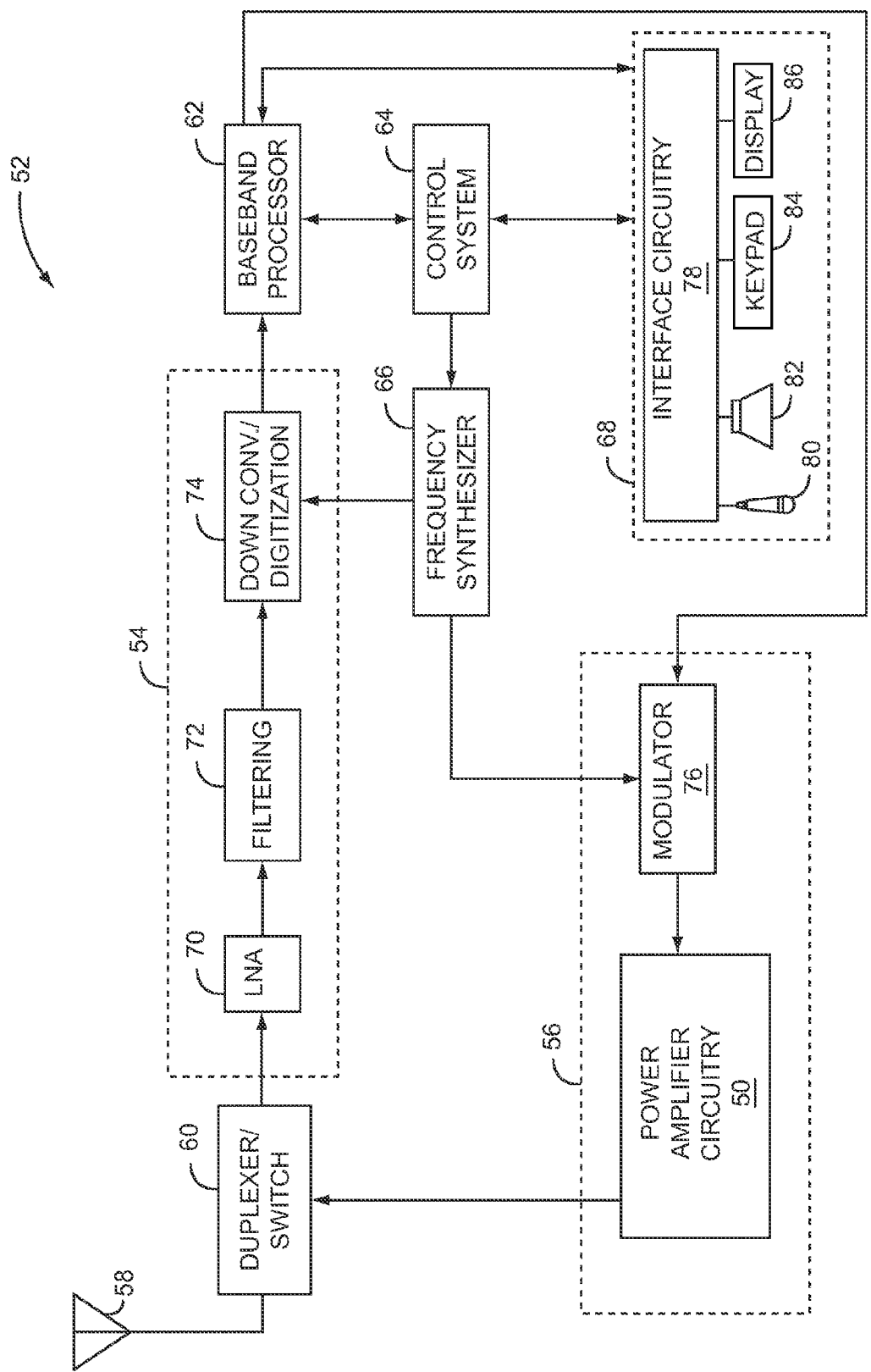
FIG. 22 shows an application example of the present invention used in a mobile terminal.

An application example of an active bias Darlington pair amplifier 12 is its use in power amplifier circuitry 50 in a mobile terminal 52, the basic architecture of which is represented in FIG. 22. The mobile terminal 52 may include a receiver front end 54, a radio frequency transmitter section 56, an antenna 58, a duplexer or switch 60, a baseband processor 62, a control system 64, a frequency synthesizer 66, and an interface 68. The receiver front end 54 receives information bearing radio frequency signals from one or more remote transmitters provided by a base station (not shown). A low noise amplifier (LNA) 70 amplifies the signal. A filter circuit 72 minimizes broadband interference in the received signal, while down conversion and digitization circuitry 74 down converts the filtered, received signal to an intermediate or baseband frequency signal, which is then digitized into one or more digital streams. The receiver front end 54 typically uses one or more mixing frequencies generated by the frequency synthesizer 66. The baseband processor 62 processes the digitized received signal to extract the information or data bits conveyed in the received signal. This processing typically comprises demodulation, decoding, and error correction operations. As such, the baseband processor 62 is generally implemented in one or more digital signal processors (DSPs).

On the transmit side, the baseband processor 62 receives digitized data, which may represent voice, data, or control information, from the control system 64, which it encodes for transmission. The encoded data is output to the transmitter 56, where it is used by a modulator 76 to modulate a carrier signal that is at a desired transmit frequency. The power amplifier circuitry 50 amplifies the modulated carrier signal to a level appropriate for transmission, and delivers the amplified and modulated carrier signal to the antenna 58 through the duplexer or switch 60.

A user may interact with the mobile terminal 52 via the interface 68, which may include interface circuitry 78 associated with a microphone 80, a speaker 82, a keypad 84, and a display 86. The interface circuitry 78 typically includes analog-to-digital converters, digital-to-analog converters, amplifiers, and the like. Additionally, it may include a voice encoder/decoder, in which case it may communicate directly with the baseband processor 62. The microphone 80 will typically convert audio input, such as the user's voice, into an electrical signal, which is then digitized and passed directly or indirectly to the baseband processor 62. Audio information encoded in the received signal is recovered by the baseband processor 62, and converted by the interface circuitry 78 into an analog signal suitable for driving the speaker 82. The keypad 84 and display 86 enable the user to interact with the mobile terminal 52, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. A circuit comprising:
   a first bipolar transistor element comprising:
      a first emitter;
      a first base; and
      a first collector adapted to provide a radio frequency (RF) output signal;
   a second bipolar transistor element comprising:
      a second emitter coupled to the first base;
      a second base adapted to receive an RF input signal; and
      a second collector coupled to the first collector; and
   feedback and active bias circuitry:
      adapted to:
         sense bias conditions at the first emitter via a bias sense input;
         sense RF output conditions at the first collector via an RF output sense input; and
         provide bias and feedback to the second base via a feedback and bias output based on the bias conditions and the RF output conditions; and
      comprising a feedback network and a feedback filter coupled in series between the feedback and bias output and the RF output sense input, such that the feedback network provides feedback to the second bipolar transistor element and the feedback filter provides frequency dependent feedback to the second bipolar transistor element,
   wherein the first and second bipolar transistor elements form a Darlington amplifier adapted to amplify the RF input signal to provide the RF output signal.

2. The circuit of claim 1 further comprising first emitter circuitry coupled between the first emitter and a first direct current (DC) reference, such that the bias conditions are based on a first voltage across the first emitter circuitry, and the first bipolar transistor element comprises a first NPN bipolar transistor element and the second bipolar transistor element comprises a second NPN bipolar transistor element.

3. The circuit of claim 2 wherein the first DC reference is ground.

4. The circuit of claim 2 further comprising alternating current (AC) blocking circuitry coupled between the first collector and a second DC reference.

5. The circuit of claim 4 wherein a voltage difference between the first DC reference and the second DC reference is less than or equal to about five volts.

6. The circuit of claim 1 wherein the bias sense input is coupled directly to the first emitter.

7. A circuit comprising:
   a first bipolar transistor element comprising:
      a first emitter;
      a first base; and
      a first collector adapted to provide a radio frequency (RF) output signal;
   a second bipolar transistor element comprising:
      a second emitter coupled to the first base;
      a second base adapted to receive an RF input signal; and
      a second collector coupled to the first collector;
   feedback and active bias circuitry adapted to:
      sense bias conditions at the first emitter via a bias sense input;
      sense RF output conditions at the first collector via an RF output sense input; and
      provide bias and feedback to the second base via a feedback and bias output based on the bias conditions and the RF output conditions;
   first emitter isolation circuitry coupled between the bias sense input and the first emitter; and
   first emitter circuitry coupled between the first emitter and a first direct current (DC) reference,
   wherein the first and second bipolar transistor elements form a Darlington amplifier adapted to amplify the RF input signal to provide the RF output signal; and the first bipolar transistor element, the first emitter isolation circuitry, and the first emitter circuitry form a first output circuit.

8. The circuit of claim 7 wherein the first emitter circuitry comprises a first resistive element and the first emitter isolation circuitry comprises a second resistive element.

9. The circuit of claim 7 further comprising at least one output circuit, wherein one of the at least one output circuit comprises:
a third bipolar transistor element comprising:
a third emitter;
a third base coupled to the first base; and
a third collector coupled to the first collector;
second emitter circuitry coupled between the third emitter and the first DC reference; and
second emitter isolation circuitry coupled between the third emitter and the bias sense input.

10. The circuit of claim 1 wherein the feedback and active bias circuitry comprises a feedback network and a feedback filter coupled in series between the feedback and bias output and the RF output sense input, wherein the feedback network provides feedback to the second bipolar transistor element and the feedback filter provides frequency dependent feedback to the second bipolar transistor element.

11. The circuit of claim 1 wherein the feedback and active bias circuitry comprises:
the feedback network coupled between a first node and the feedback and bias output to provide feedback to the second base;
the feedback filter coupled between the first node and the RF output sense input to provide frequency dependent feedback to the second base;
a level shifting circuit comprising:
a first input coupled to the first node;
a second input coupled to the bias sense input; and
a first output, such that a signal at the second input is level-shifted and provided to the first output; and
a transistor bias circuit comprising:
a third input coupled to the first output;
a second output coupled to the first node; and
a third output coupled to a first direct current (DC) reference,
wherein a bias signal is provided to the second output based on a signal at the third input and the first DC reference.

12. The circuit of claim 11 wherein the feedback and active bias circuitry further comprises a first resistive element coupled between the first output and the third input.

13. The circuit of claim 11 wherein the feedback and active bias circuitry further comprises an alternating current (AC) tune circuit coupled between the third input and the third output, wherein the bias and feedback provided to the second base are further based on the RF output signal.

14. The circuit of claim 13 wherein the AC tune circuit comprises a first resistive element and a first capacitive element coupled in series between the third input and the third output.

15. The circuit of claim 11 wherein:
the feedback network comprises a first resistive element coupled between the first node and the feedback and bias output; and
the feedback filter comprises a second resistive element and a first capacitive element coupled in parallel between the first node and the RF output sense input.

16. The circuit of claim 11 wherein:
the level shifting circuit comprises:
a first resistive element coupled between the first input and the first output; and
a first diode element comprising:
a cathode coupled to the second input; and
an anode coupled to the first output; and
the transistor bias circuit comprises:
a third bipolar transistor element comprising:
a third emitter;
a third base coupled to the third input; and
a third collector;
a second resistive element coupled between the third collector and the second output; and
a third resistive element coupled between the third emitter and the third output.

17. The circuit of claim 1 wherein the feedback and active bias circuitry comprises a feedback network coupled between the RF output sense input and the feedback and bias output, wherein the feedback network provides feedback to the second bipolar transistor element.

18. A circuit comprising:
a first bipolar transistor element comprising:
a first emitter;
a first base; and
a first collector adapted to provide a radio frequency (RF) output signal;
a second bipolar transistor element comprising:
a second emitter coupled to the first base;
a second base adapted to receive an RF input signal; and
a second collector coupled to the first collector; and
feedback and active bias circuitry:
adapted to:
sense bias conditions at the first emitter via a bias sense input;
sense RF output conditions at the first collector via an RF output sense input; and
provide bias and feedback to the second base via a feedback and bias output based on the bias conditions and the RF output conditions; and
comprising a feedback network coupled between the RF output sense input and the feedback and bias output, such that the feedback network provides feedback to the second bipolar transistor element;
a level shifting circuit comprising:
a first input coupled to the RF output sense input;
a second input coupled to the bias sense input; and
a first output, such that a signal at the second input is level-shifted and provided to the first output; and
a transistor bias circuit comprising:
a third input coupled to the first output;
a second output coupled to the feedback and bias output; and
a third output coupled to a first direct current (DC) reference,
wherein the first and second bipolar transistor elements form a Darlington amplifier adapted to amplify the RF input signal to provide the RF output signal, and a bias signal is provided to the second output based on a signal at the third input and the first DC reference.

19. The circuit of claim 18 wherein the feedback and active bias circuitry further comprises an alternating current (AC) tune circuit coupled between the third input and the third output, wherein the bias and feedback provided to the second base are further based on the RF output signal.

20. The circuit of claim 19 wherein the AC tune circuit comprises a first capacitive element coupled between the third input and the third output.

21. The circuit of claim 18 wherein:
the level shifting circuit comprises:
a first resistive element coupled between the first input and the first output; and
a first diode element comprising:
a cathode coupled to the second input; and
an anode coupled to the first output; and
the transistor bias circuit comprises:
a third bipolar transistor element comprising:
a third emitter;
a third base coupled to the third input; and
a third collector coupled to the second output; and a second resistive element coupled between the third emitter and the third output.

22. The circuit of claim 1 wherein the first base is coupled directly to the second emitter.

23. The circuit of claim 1 further comprising emitter-to-base circuitry coupled between the first base and the second emitter.

24. The circuit of claim 23 wherein the emitter-to-base circuitry comprises a first resistive element coupled between the first base and the second emitter.

25. A circuit comprising:
a first field effect transistor (FET) element comprising:
   a first source;
   a first gate; and
   a first drain adapted to provide a radio frequency (RF) output signal;
a second FET element comprising:
   a second source coupled to the first gate;
   a second gate adapted to receive an RF input signal; and
   a second drain coupled to the first drain; and
feedback and active bias circuitry:
   adapted to:
      sense bias conditions at the first source via a bias sense input;
      sense RF output conditions at the first drain via an RF output sense input; and
      provide bias and feedback to the second gate via a feedback and bias output based on the bias conditions and the RF output conditions; and
   comprising a feedback network and a feedback filter coupled in series between the feedback and bias output and the RF output sense input, such that the feedback network provides feedback to the second FET element and the feedback filter provides frequency dependent feedback to the second FET element,
wherein the first and second FET elements form a Darlington amplifier adapted to amplify the RF input signal to provide the RF output signal.

* * * * *